(12) United States Patent
Ushikura et al.

(10) Patent No.: US 8,859,326 B2
(45) Date of Patent: Oct. 14, 2014

(54) THIN FILM TRANSISTOR AND METHOD OF FABRICATING THE SAME USING AN ORGANIC SEMCONDUCTOR LAYER AND AN ORGANIC ACCEPTOR-DONOR LAYER

(75) Inventors: Shinichi Ushikura, Kanagawa (JP); Mao Katsuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 79 days.

(21) Appl. No.: 13/154,038

(22) Filed: Jun. 6, 2011

(65) Prior Publication Data
US 2012/0007060 A1 Jan. 12, 2012

(30) Foreign Application Priority Data

Jul. 7, 2010 (JP) .................................. 2010-154779

(51) Int. Cl.
*H01L 51/40* (2006.01)
*H01L 51/05* (2006.01)
*H01L 51/52* (2006.01)
*H01L 51/00* (2006.01)

(52) U.S. Cl.
CPC ......... *H01L 51/0512* (2013.01); *H01L 51/0055* (2013.01); *H01L 51/52* (2013.01); *H01L 51/0562* (2013.01)
USPC .......................... 438/99; 257/40; 257/E51.005

(58) Field of Classification Search
CPC . H01L 51/52; H01L 51/0512; H01L 51/0562; H01L 51/0055
USPC .................................. 438/99; 257/40, E51.005
See application file for complete search history.

(56) References Cited

U.S. PATENT DOCUMENTS 7,332,854 B2 * 2/2008 Kai et al. ....................... 313/292
7,355,198 B2 * 4/2008 Suh et al. .......................... 257/40

FOREIGN PATENT DOCUMENTS

JP 2008-243911 10/2008
WO WO 2010/015822 * 2/2010 .............. 438/99

OTHER PUBLICATIONS

C. C. Kuo and T. N. Jackson; Direct lighographic top contacts for pentacene organic organic thin-film transistors; Applied Physics Letters 94; 053304; 2009.
Jae-Hyun Lee et al.; Effectiveness of p-dopants in an organic hole transporting material; Applied Physics Letters 94; 123306; 2009.
Masataka Kano et al.; Improvement of subthreshold current transport by contact interface modification in p-type organic field-effect transistors; Applied Physics Letters 94; 143304; 2009.

* cited by examiner

*Primary Examiner* — Stephen W Smoot
*Assistant Examiner* — Vicki B Booker
(74) *Attorney, Agent, or Firm* — Dentons US LLP

(57) ABSTRACT

A thin film transistor including a contact layer that contains an organic semiconductor layer over a substrate, a contact layer containing an organic semiconductor material, an acceptor or donor material provided between an organic semiconductor layer, and a source electrode and a drain electrode at opposite end portions of the contact layer; and a method of fabricating same.

4 Claims, 13 Drawing Sheets

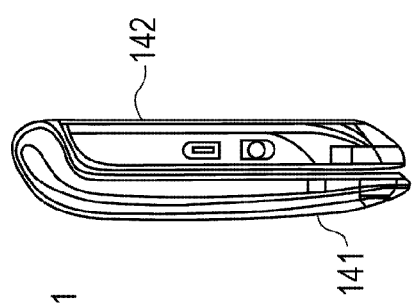
FIG. 16A
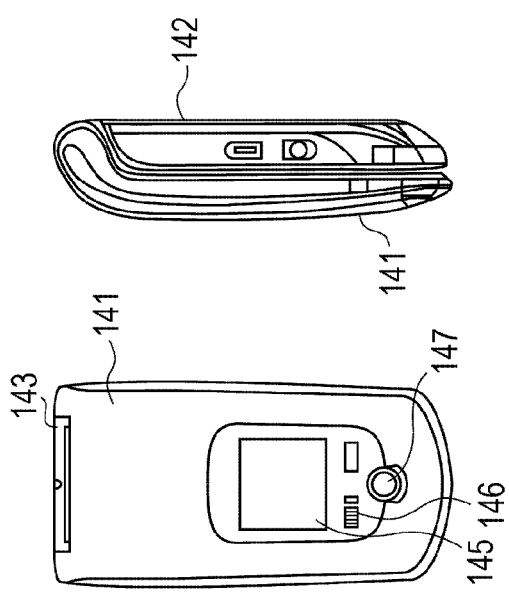
FIG. 16B
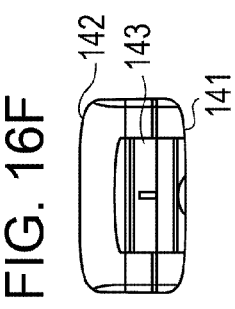
FIG. 16D
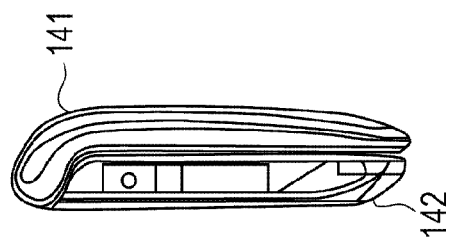
FIG. 16F  FIG. 16C
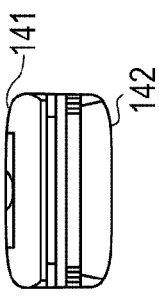
FIG. 16G
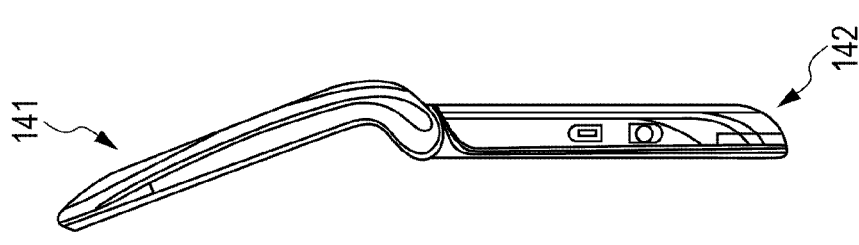
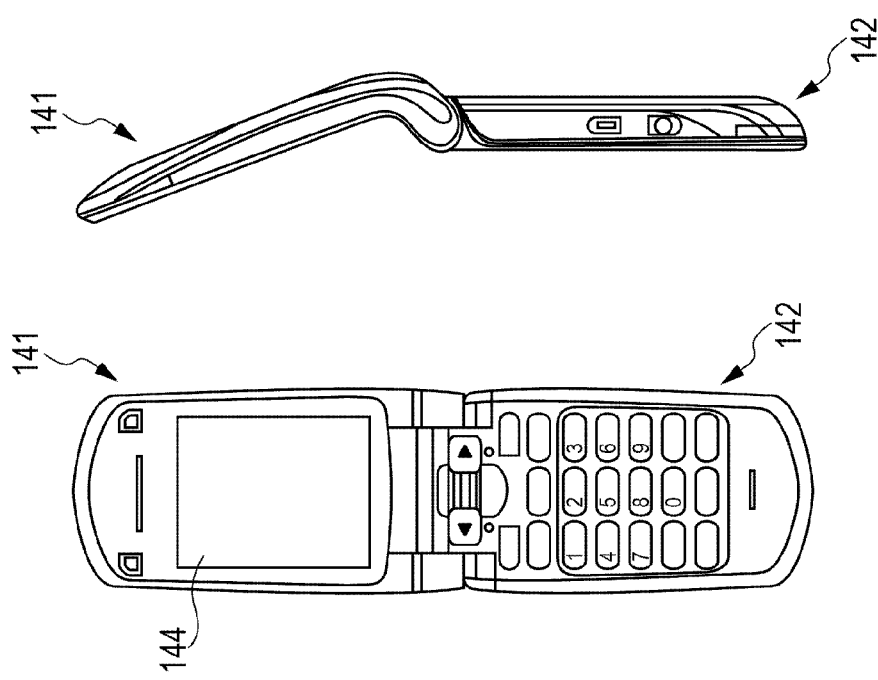
FIG. 16E 0# THIN FILM TRANSISTOR AND METHOD OF FABRICATING THE SAME USING AN ORGANIC SEMCONDUCTOR LAYER AND AN ORGANIC ACCEPTOR-DONOR LAYER

RELATED APPLICATION DATA

The present application contains subject matter related to Japanese Priority Patent Application JP 2009-204285 filed in the Japan Patent Office on Sep. 4, 2009 and Japanese Priority Patent Application JP 2010-154779 filed in the Japan Patent Office on Jul. 7, 2010, the entire contents of which are hereby incorporated by reference to the extent permitted by law.

BACKGROUND

The present disclosure relates to a thin film transistor equipped with an organic semiconductor layer, a method of manufacturing the thin film transistor, a display device that uses the thin film transistor, and electronic equipment that uses the thin film transistor.

In a thin film transistor that uses an organic semiconductor layer, it is important to promote a reduction in contact resistance between the organic semiconductor layer and a source electrode/a drain electrode in realizing a high ON current and a steep sub-threshold slope.

Thus, in a thin film transistor of a p channel type of a top contact and bottom gate structure; on the organic semiconductor later, a source electrode/a drain electrode is provided in which an interfacial layer formed of an acceptor material such as molybdenum oxide ($MoO_x$) and a conductive layer are stacked in this order. As a result, a configuration is suggested which promotes a reduction in contact resistance between the organic semiconductor layer and the source electrode/drain electrode (see "APPLIED PHYSICS LETTERS 94", (2009), p. 143304-1 to p. 143304-3).

Furthermore, in the thin film transistor of a p channel type of the bottom contact and bottom gate structure, on a gate insulating film, the source electrode/the drain electrode are provided in which the interfacial layer formed of the acceptor material and the conductive layer as above are stacked in this order. Moreover, an organic semiconductor layer is provided on a gate insulating film between the source electrode and the drain electrode. As a result, a configuration is suggested in which the interfacial layer is disposed adjacent to the channel region in the organic semiconductor layer, thereby promoting a reduction in contact resistance of the source electrode/drain electrode in regard to the channel region (see Japanese Unexamined Patent Application Publication No. 2008-243911).

SUMMARY

Incidentally, in order to achieve a miniaturization of an element structure in a thin film transistor, a lithography process is applied to the formation of the source electrode and the drain electrode. In this case, the lithography process is applied to an upper portion of an electrode material film to form a resist pattern, and the electrode material film is subjected to a pattern etching using the resist pattern as a mask, thereby forming a minute source electrode and drain electrode. In the pattern etching of the electrode material film, etching is performed which uses an aqueous solution for an etchant so that a channel interface of a gate insulating film formed of an organic semiconductor layer or an organic insulation material is not damaged.

However, since in the etching which uses the aqueous solution for the etchant, the etching damage is applied to the interfacial layer formed of the acceptor material such as molybdenum oxide ($MoO_x$) described above, application to the miniaturization process is difficult.

Thus, it is desirable to provide a thin film transistor which can apply a miniaturization process while promoting a contact resistance between an organic semiconductor layer and a source electrode/a drain electrode, and has satisfactory properties. Furthermore, it is desirable to provide a method of manufacturing the thin film transistor having such a property, and a display device and electronic equipment that uses the thin film transistor.

According to an embodiment of the present disclosure, there is provided a thin film transistor in which a contact layer containing an organic semiconductor material and an acceptor material or a donor material is provided between the organic semiconductor layer and the source electrode/drain electrode.

The contact layer having such a configuration contains the acceptor material or the donor material as impurities in the organic semiconductor material and has conductivity better than the organic semiconductor material. As a result, the contact resistance between the organic semiconductor layer and the source electrode/the drain electrode is reduced. Furthermore, the conductivity of the contact layer is adjusted by the content of the acceptor material or the donor material, and thus the contact layer becomes a part of the organic semiconductor material. For this reason, the contact layer remains between the source electrode and the drain electrode as it is. As a result, for example, in a top contact type, the contact layer becomes a protective film against the organic semiconductor layer. Furthermore, in a bottom contact type, the contact layer becomes a base, and the cutting of the organic semiconductor layer can be prevented. Thus, the organic semiconductor layer can be maintained in an expected state. In addition, since the contact layer has a configuration that contains the organic semiconductor material, the etchant solution affecting the contact layer when performing a pattern formation of the source electrode/drain electrode in the top contact type is suppressed. Thus, it is possible to apply the miniaturization process in the pattern formation of the source electrode/drain electrode.

Furthermore, according to another embodiment of the present disclosure, there is provided a method of manufacturing a thin film transistor including the sequence as below. Firstly, an organic semiconductor layer is formed over a substrate, and then, a contact layer containing an organic semiconductor material and an acceptor material or a donor material is formed on the organic semiconductor layer. Thereafter, a source electrode/a drain electrode is formed in the state of oppositely disposing end portions on the formed contact layer.

The method of manufacturing the thin film transistor performing such a sequence includes a formation of the source electrode/drain electrode in the upper portion of the contact layer which contains the acceptor material or the donor material as impurities regarding the organic semiconductor material. For this reason, even in a case of applying the miniaturization process upon performing the pattern formation of the source electrode/drain electrode formed of a metallic material, the etchant solution affecting the contact layer containing the organic semiconductor material is suppressed. As a result, it is possible to obtain a thin film transistor having a configuration in which a contact layer is reliably left between the organic semiconductor layer and the source electrode/drain electrode. Furthermore, since the contact layer becomes a protective film against the organic semiconductor layer, the organic semiconductor layer can be maintained in an expected state.

Furthermore, according to still another embodiment of the present disclosure, there is provided a display device and electronic equipment including the thin film transistor according to an embodiment of the present disclosure.

As described above, according to the embodiments of the present disclosure described above, it is possible to promote a reduction in contact resistance between the organic semiconductor layer and the source electrode/drain electrode by the contact layer while applying the miniaturization process to the formation of the source electrode/drain electrode, and to maintain the organic semiconductor layer in an expected state. As a consequence, it is possible to promote the miniaturization and improve the properties of the thin film transistor using the organic semiconductor layer, and it is possible to achieve high integration and a high functionality of the display device and the electronic equipment using the thin film transistor.

BRIEF DESCRIPTION OF THE DRAWINGS

FIG. 16A is a front view that shows a mobile terminal device, for example, a mobile phone, using the display device according to an embodiment of the present disclosure in an open state;

FIG. 16B is a side view thereof;

FIG. 16C is a front view thereof in a closed state;

FIG. 16D is a left side view thereof;

FIG. 16E is a right side view thereof;

FIG. 16F is a top view thereof; and

FIG. 16G is a bottom view thereof.

DETAILED DESCRIPTION OF EMBODIMENTS

Figure 1:
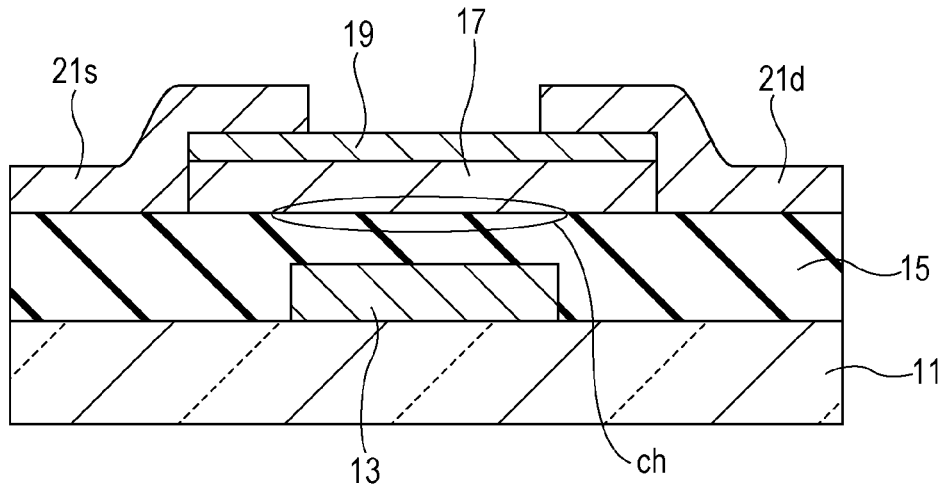
FIG. 1 is a cross-sectional view that shows a configuration of a thin film transistor according to a first embodiment of the present disclosure.

Hereinafter, embodiments of the present disclosure will be described in the sequence described below based on the drawings.

1. First Embodiment (First Example of Thin Film Transistor of Top Contact Bottom Gate Structure)
2. Second Embodiment (Second Example of Thin Film Transistor of Top Contact Bottom Gate Structure)
3. Third Embodiment (First Example of Thin Film Transistor of Top Contact Bottom Gate Structure Provided with Protective Film)
4. Fourth Embodiment (Second Example of Thin Film Transistor of Top Contact Bottom Gate Structure Provided with Protective Film)
5. Fifth Embodiment (Example of Thin Film Transistor of Bottom Contact Top Gate Structure)
6. Sixth Embodiment (Application Example to Display Device Using Thin Film transistor)
7. Seventh Embodiment (Application Example to Electronic Equipment)

Furthermore, in the first to fifth embodiments, the same components will be denoted by the same reference numerals, and the repeated description will be omitted.

1. First Embodiment

FIG. 1 is a cross-sectional view of a thin film transistor 1-1 of a first embodiment. The thin film transistor 1-1 shown in FIG. 1 has a top contact bottom gate structure, and a gate insulating film 15 is provided on a substrate 11 in the state of covering a gate electrode 13. On an upper portion of the gate insulating film 15, a stacked body of an organic semiconductor layer 17 and a contact layer 19 is provided in this order. The stacked body is patterned in an island shape which covers the gate electrode 13 in a width direction, and is provided in the state of being stacked on the gate electrode 13 via a gate insulating film 15. Furthermore, on the gate insulating film 15, a source electrode 21s/drain electrode 21d are provided in a position of being oppositely disposed with the gate electrode 13 interposed therebetween. In the source electrode 21s/the drain electrode 21d, edge portions thereof disposed oppositely with the gate electrode 13 interposed therebetween are provided in the state of being stacked on the contact layer 19.

In the configuration described above, in the first embodiment, the contact layer 19 having the same pattern as the organic semiconductor layer 17 is stacked on the organic semiconductor layer 17, and the contact layer 19 contains an organic semiconductor material and an acceptor material or a donor material. Hereinafter, the details of the configuration will be described in order from a lower layer.

Substrate 11

At least a surface of the substrate 11 may be maintained in an insulated state, and, for example, a plastic substrate formed of PES (polyether sulfone), PEN (polyethylene naphthalate), PET (polyethylene-terephthalate), PC (polycarbonate), or the like is used as the substrate 11. Furthermore, a substrate in which a metallic foil such as stainless steel (SUS) is laminated with resin, a glass substrate, or the like may be used. In order to obtain a flexible flexibility, a substrate, which uses the plastic substrate or the metallic foil, is applied.

Gate Electrode 13

As the gate electrode 13, gold (Au), aluminum (Al), silver (Ag), copper (Cu), platinum (Pt), nickel (Ni), or the like are used. In the case of using gold (Au), it is possible to promote an improvement in adherence with the substrate 11 by stacking chromium (Cr) as a ground layer.

Gate Insulating Film 15

As the gate insulating film 15, organic insulating films such as PVP (polyvinyl pyrrolidone), PMMA (polymethyl methacrylate), and PVA (polyvinyl alcohol) are used. Furthermore, as the gate insulating film 15, in addition to the organic insulation material, inorganic insulating films such as silicon oxide ($SiO_2$), aluminum oxide ($Al_2O_3$), and tantalum oxide ($Ta_2O_5$) may be used.

Organic Semiconductor Layer 17

In the organic semiconductor layer 17, as p type organic semiconductor materials, organic semiconductor materials such as pentacene, anthracene or phthalocyanine, porphyrin, thiophene-based polymers, and derivates thereof are used. As n-type organic semiconductor materials, semiconductor materials such as fullerene, perfluoropentacene, and poly(benzobisimidazo-benzophenanthroline) are used.

Contact Layer 19

The contact layer 19 is formed using the organic semiconductor material and the acceptor material or the donor material as mentioned above. The acceptor material or the donor material and the organic semiconductor material forming the contact layer 19 are suitably selected and used to meet the conductivity type of the organic semiconductor layer 17.

For example, it is desirable that the organic semiconductor material forming the contact layer 19 uses the material showing the same conductivity type as the organic semiconductor material forming the organic semiconductor layer 17, and other materials may be used.

Furthermore, when the conductivity type of the organic semiconductor layer 17 is the p type, the contact layer 19 is formed using an organic semiconductor material having a conductivity type of the p type and the acceptor material. Meanwhile, when the conductivity type of the organic semiconductor layer 17 is the n type, the contact layer 19 is formed using an organic semiconductor material having a conductivity type of the n type and the donor material.

The contents of the acceptor material and the donor material in the contact layer 19 are adjusted such that the OFF current flowing between the source electrode 21s-the drain electrode 21d via the contact layer 19 is, for example, kept low enough to be equal to or less than about $10^{-12}$ A. Hereinafter, specific examples of the acceptor material and the donor material will be described.

A specific example of the acceptor material is as below.

[Metallic Oxide]
$MoO_x$, $ReO_3$, $V_2O_5$, $WO_3$, $TiO_2$, $AuO$, $Al_2O_3$, $CuO$

[Oxide]
$SO_3$

[Metal Halide]
$CuI$, $SbCl_5$, $SbF_5$, $FeCl_3$, $LiF$, $BaF_2$, $CaF_2$, $MgF_2$

[Halide]
$AsF_5$, $BF_3$, $BCl_3$, $BBr_3$, $PF_5$

[Metal Carboxylate]
$CaCO_3$, $BaCO_3$, $Li_2CO_3$

[Organic Molecular, Complex]

As the p-benzoquinone class, 2,3,5,6-tetracyano-(p-cyanyl), 2,3-dibromo-5,6-dicyano-p-benzoquinone, 2,3-dichloro-5,6-dicyano-p-benzoquinone, 2,3,-diiodo-5,6-dicyano-p-benzoquinone, 2,3-dicyano-p-benzoquinone, p-bromanil, p-chloranil, p-iodanil, p-fluoranil, 2,5-dichloro-p-benzoquinone, 2,6,-dichloro-p-benzoquinone, chloranilic acid, bromanilic acid, 2,5,-dihydrixy-p-benzoquinone, 2,5-dichloro-3,6-dimethyl-p-benzoquinone, 2,5-dibromo-3,6-dimethyl-p-benzoquinone, BTDAQ, p-benzoquinone, 2,5-dimethyl-p-benzoquinone, 2,6-dimethyl-p-benzoquinone, tetramethylenediame, o-benzoquinones, o-bromanil, o-chloranil, 1,4-naphthoquinones, 2,3-dicyano-5-nitro-1,4-naphthoquinone, 2,3-dicyano-1,4-naphthoquinone, 2,3-dichloro-5-nitro-1,4-naphthoquinone, 2,3-dichloro-1,4-naphthoquinone, and 1,4-naphthoquinone are exemplified.

As the diphenoquinone class, 3,3',5,5'-tertabromo-diphenoquinone, 3,3',5,5'-tetrachloro-diphenoquinone, and diphenoquinone are exemplified.

As the TCNQ class and analog, tetracyano-quinodimethane (TCNQ), tetrafluoro-tetracyano-quinodimethane (F4-TCNQ), trifluoromethyl-TCNQ, 2,5-difluoro-TCNQ, monofluoro-TCNQ, TNAP, decyl-TCNQ, methyl-TCNQ, dihydrobarereno-TCNQ, tetrahydroberberine-TCNQ, dimethyl-TCNQ, diethyl-TCNQ, benzo-TCNQ, dimethoxy-TCNQ, BTDA-TCNQ, diethoxy-TCNQ, tetramethyl-TCNQ, tetracyanoanthraquinodimethane, polynitro compounds, tetranitrobiphenol, dinitrobiphenyl, picric acid, trinitrobenzene, 2,6-dinitrophenol, and 2,4-dinitrophenol are exemplified.

As the fluorine class, 9-dicyanomethylene-2,4,5,7-tetranitro-fluorine, 9-dicyanomethylene-2,4,7-trinitro-fluorine, 2,4,5,7-tetranitro-fluorenone and 2,4,7-trinitro-fluorenone are exemplified.

As the benzocyano class and analogs, (TBA)2HCTMM, (TBA)2HCDAHD, K•CF, TBA•PCA, TBA•MeOTCA, TBA•EtOTCA, TBA•PrOTCA, (TBA)2HCP, hexacyanobutadienetetracyanoethylene and 1,2,4,5-tetracyanobenzene are exemplified.

As the transition metal complex class, $(TPP)_2Pd(dto)_2$, $(TPP)_2Pt(dto)_2$, $(TPP)_2Ni(dto)_2$, $(TPP)_2Cu(dto)_2$, and $(TBA)_2 Cu(ox)_2$ are exemplified.

A specific example of the donor material is as below.

[Metal]
Li, Cs

[Metal Carboxylate]
$Cs_2O_3$, $Rb_2CO_3$

[Organic Molecule, Complex]

As the aromatic hydrocarbon and analogs, tetracene, perylene, anthracene, coronene, pentacene, chrysene, phenanthrene, naphthalene, p-dimethoxybenzene, rubrene, and hexamethoxytriphenylene are exemplified.

As the TTF class and analog, HMTTF, OMTTF, TMTTF, BEDO-TTF, TTeCn-TTF, TMTSF, EDO-TTF, HMTSF, TTF, EOET-TTF, EDT-TTF, (EDO)2DBTTF, TSCn-TTF, HMT-TeF, BEDT-TTF, CnTET-TTF, TTCn-TTF, TSF, DBTTF are exemplified.

As the TTT class, tetrathiotetracene, tetraselenotetracene, and tetratellurotetracene are exemplified.

As the azine class, dibenzo[c,d]-phenothiazine, benzo[c]-phenothiazine, phenothiazine, N-methyl-phenothiazine, dibenzo-[c,d]-phenoselenazine, N,N-dimethylphenazine, and phenizine are exemplified.

As the monoamine class, N,N-diethyl-m-toluidine, N,N-diethylaniline, N-ethyl-o-toluidine, diphenylamine, skatole, indole, N,N-dimethyl-o-toluidine, o-toluidine, m-toluidine, aniline, o-chloroaniline, o-bromoaniline, and p-nitroaniline are exemplified.

As the diamine class, N,N,N',N'-tetramethyl-p-phenylene diamine, 2,3,5,6-tetramethyl-(durenediamine), p-phenyldiamine, N,N,N',N'-tetramethylbenzidine, 3,3'5,5'-tetramethylbenzidine, 3,3'-dimethylbenzidine, 3,3'-dimethoxybenzidine, benzidine, 3,3'-dibromo-5,5'-dimethylbenzidine, 3,3'-dichloro-5,5'-dimethylbenzidine, and 1,6-diaminopyrene are exemplified.

As the remainder, 4,4',4''-tris(N-3-methylphenyl-N-phenylamino)-triphenylamine:(m-MTDATA), 4,4',4''-tris(N-(2-naphtyl)-N-phenylamino)-triphenylamine:(2TNATA), α-NDP, copper phthalocyanine, 1,4,6,8-tetrakisdimethylaminopyrene, 1,6-dithiopyrene, decamethylferrocene, and ferrocene are exemplified.

Source Electrode 21$s$/Drain Electrode 21$d$

The source electrode 21$s$ and the drain electrode 21$d$ may be joined by an ohmic contact to the contact layer 19. For this reason, the electrodes may be formed of, for example, gold (Au), copper (Cu), silver (Ag), or the like or may be pattern formed using a conductive ink containing a conductive particulate.

Manufacturing Method

Next, a method of manufacturing the thin film transistor 1-1 of the first embodiment will be described based on the cross-section process diagrams of FIGS. 2A and 2B.

Figure 2A:
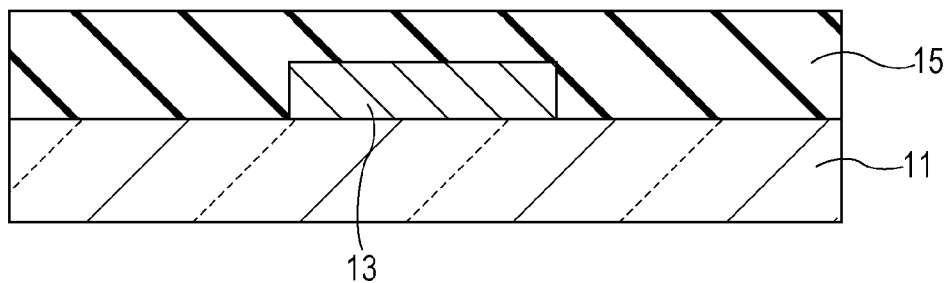
FIGS. 2A and 2B are cross-sectional process diagrams that show a manufacturing method of the thin film transistor according to the first embodiment.

Firstly, as shown in FIG. 2A, the gate electrode 13 is subjected to the pattern formation on the substrate 11, and the same is covered with the gate insulating film 15. The formation of the gate electrode 13 is performed by forming a metallic material film by a suitably selected method such as a vapor deposition method or a sputtering method, forming a resist pattern on the upper portion thereof by a photolithography method, and performing the pattern etching of the metallic material film using the resist pattern as a mask. Furthermore, in the formation of the gate electrode 13, in addition to the aforementioned method, a printing technique such as screen printing, gravure printing, and an ink jet printing may be applied.

In the case of using the organic insulation material, the film formation of the gate insulating film 15 is performed by applying an application method including printing methods such as a spin coat method, screen printing, gravure printing, and an ink jet method. Meanwhile, in the case of using an inorganic insulation material, film formation is performed by applying vapor deposition, sputtering, and a CVD method.

Figure 2B:
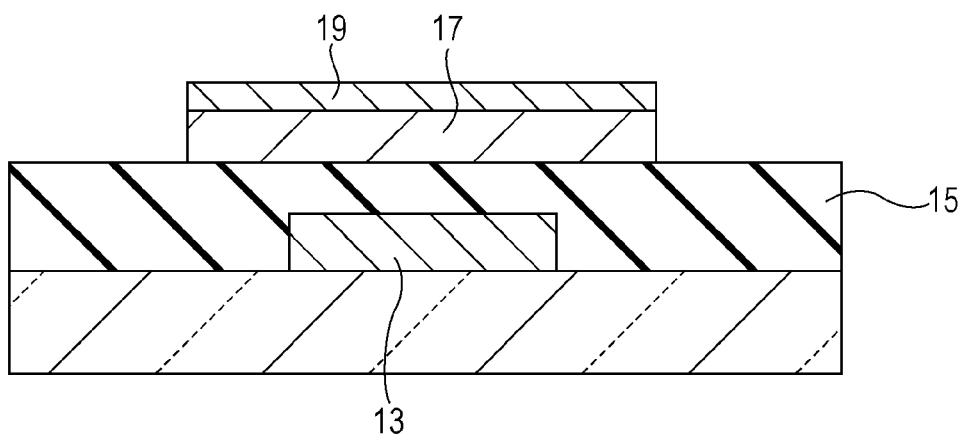

Next, as shown in FIG. 2B, in a position of covering the gate electrode 13 on the gate insulating film 15, the stacked body of the organic semiconductor layer 17 and the contact layer 19 is pattern formed in an island shape.

Herein, for example, the pattern vapor deposition method using a mask is applied, and the organic semiconductor material is firstly vapor-deposited to perform the pattern formation of the organic semiconductor layer 17, and then, the organic semiconductor material and the acceptor material or the donor material are subjected to co-deposition to perform the pattern formation of the contact layer 19. At this time, the contact layer 19 of the same shape is subjected to the pattern formation of the organic semiconductor layer 17. Furthermore, for example, the organic semiconductor layer 17 and the contact layer 19 may be sequentially formed and may be patterned by the same process. Furthermore, the printing method is applied, the organic semiconductor layer 17 may be firstly subject to the pattern printing, and then, the contact layer 19 may be pattern printed using an ink liquid in which the organic semiconductor material and the acceptor material or the donor material are mixed with each other. Furthermore, in a case where the organic semiconductor layer 17 and the contact layer 19 are not patterned and the element does not have to be isolated, the layers 17 and 19 may be sequentially coated and formed.

After that, as shown in FIG. 1, the source electrode 21$s$ and the drain electrode 21$d$ are formed on the gate insulating film 15. It is desirable that the source electrode 21$s$/the drain electrode 21$d$ are formed as minute patterns by applying, for example, the lithography method.

In this case, firstly, the electrode material film is formed on the gate insulating film 15 formed with the contact layer 19, and the resist pattern is formed on the upper portion thereof by applying the lithography method. Next, by the etching which uses the resist pattern as a mask, the electrode material film is patterned to form the source electrode 21$s$/the drain electrode 21$d$. In the etching, it is desirable to leave the contact layer 19 on the organic semiconductor layer 17 by performing wet etching. As a result, even when the organic semiconductor layer 17 is formed to have an extremely thin film thickness, initial film thickness can be maintained. Furthermore, it is possible to perform the patterning of the electrode material film without damaging the organic semiconductor layer 17 and the contact layer 19 by using the aqueous solution in the etchant in the process of the wet etching. After the patterning, the resist pattern is removed.

Furthermore, as another forming method to which the lithography method is applied, a lift-off method can be applied. In this case, firstly, on the gate insulating film 15 formed with the contact layer 19, the resist pattern is formed by applying the lithography method, and the electrode material film is formed on the upper portion thereof. Next, the electrode material film of the resist pattern is concurrently removed by removing the resist pattern, and the remaining electrode material film portion is obtained as the source electrode 21$s$/the drain electrode 21$d$.

As another forming method of the source electrode 21$s$/the drain electrode 21$d$, a shadow mask method may be applied.

According to the first embodiment, between the organic semiconductor layer 17 and the source electrode 21$s$/the drain electrode 21$d$, the contact layer 19 is provided which contains the acceptor material or the donor material as impurities in the organic semiconductor material. As a result, the contact layer 19 has a conductivity better than the organic semiconductor layer 17, whereby the contact resistance between the organic semiconductor layer 17 and the source electrode 21$s$/the drain electrode 21$d$ is reduced.

Furthermore, since the conductivity of the contact layer 19 is adjusted by the content of the acceptor material or the donor material, even when the contact layer 19 is left between the source electrode 21$s$ and the drain electrode 21$d$ as it is as a part of the organic semiconductor layer 17, an increase in the OFF current can be prevented. For this reason, when performing the pattern formation of the source electrode 21$s$/the drain electrode 21$d$, the contact layer 19 can be left as a protective film of the organic semiconductor layer 17. Thus, even when the organic semiconductor layer 17 is formed to have an extremely thin film thickness, the expected very thin film thickness can be maintained. As a result, it is possible to reduce a bulk resistance which depends on a distance (that is, the film thickness of the organic semiconductor layer 17) to a channel region ch formed on the source electrode 21$s$/the drain electrode 21$d$ and the organic semiconductor layer 17.

As a consequence, it is possible to promote an improvement in the ON current and the sharpening of the sub-threshold slope in the thin film transistor 1-1 having the top contact bottom gate structure.

Furthermore, in the manufacturing method of the first embodiment described using FIGS. 2A and 2B, the pattern formation of the source electrode 21s/the drain electrode 21d is performed on the upper portion of the contact layer 19 which contains the acceptor material or the donor material as impurities in the organic semiconductor material. For this reason, even when gold (Au), copper (Cu), silver (Ag), or the like joined by an ohmic contact to the contact layer 19 are formed as the electrode material film, and the water-soluble etchant is used in the case of performing the pattern etching thereof, the contact layer 19 is not affected. Thus, it is possible to obtain the thin film transistor 1-1 having the above configuration while performing the pattern formation of minute source electrode 21s/drain electrode 21d by applying the lithography method as the miniaturization process.

As a result, it is possible to achieve the miniaturization of the thin film transistor 1-1 in which an improvement in property is promoted.

2. Second Embodiment

Figure 3:
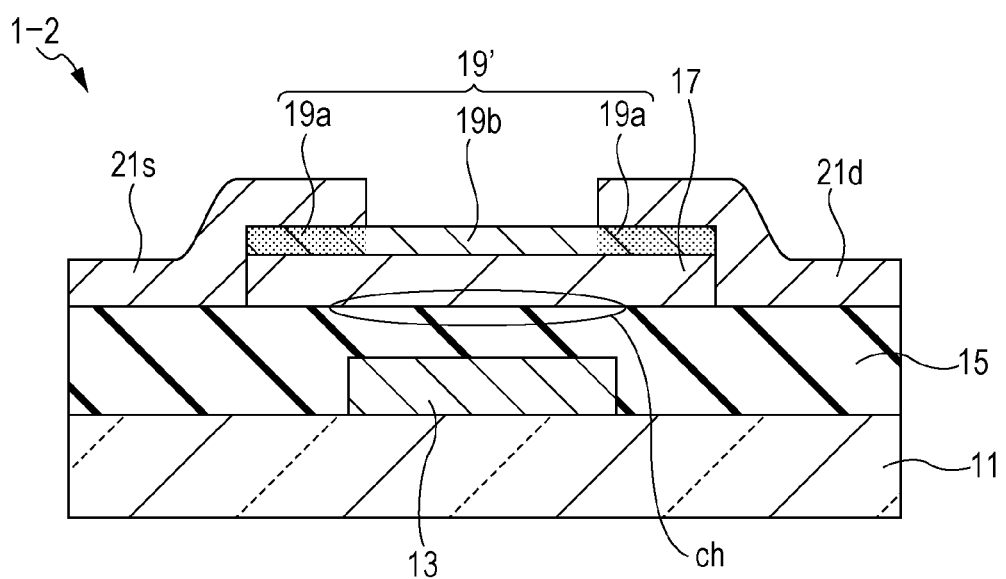
FIG. 3 is a cross-sectional view that shows a configuration of a thin film transistor according to a second embodiment.

FIG. 3 is a cross-sectional view of a thin film transistor 1-2 of a second embodiment. The thin film transistor 1-2 shown in FIG. 3 is the same as the first embodiment in that the thin film transistor 1-2 has a top contact bottom gate structure, and a contact layer 19' is formed by the use of an organic semiconductor material and an acceptor material or a donor material. Especially, in the present second embodiment, it is characteristic that the contents of the acceptor material or the donor material in the contact layer 19' are partially different from each other. Furthermore, configurations other than the contact layer 19' are the same as those of the first embodiment.

That is, the contact layer 19' can be divided into a first portion 19a interposed between the organic semiconductor layer 17 and the source electrode 21s/the drain electrode 21d, and a second portion 19b between the source electrode 21s and the drain electrode 21d. Among these, the first portion 19a has a configuration in which the content of the acceptor material and the donor material is greater than that of the second portion 19b. Furthermore, it is desirable to set a portion of the contact layer 19', which is not interposed between the organic semiconductor layer 17 and the source electrode 21s/the drain electrode 21d and is not disposed between the source electrode 21s and the drain electrode 21d, as a second portion 21b.

Herein, the content of the acceptor material or the donor material in the first portion 19a is a sufficient amount such that the contact resistance between the organic semiconductor layer 17 and the source electrode 21s/the drain electrode 21d is reduced. The content of the acceptor material or the donor material in the first portion 19a is set without being influenced by the content of the second portion 19b.

Meanwhile, the content of the acceptor material or the donor material contained in the second portion 19b is, for example, set to be equal to or less than an extent to which the OFF current flowing between the source electrode 21s and the drain electrode 21d via the contact layer 19' is kept, for example, to be equal to or less than $10^{-12}$ A. Furthermore, the content of the acceptor material or the donor material in the second portion 19b may be zero. The content of the acceptor material or the donor material in the second portion 19b is set without being influenced by the content of the first portion 19a.

In such a contact layer 19', it is desirable that the organic semiconductor material forming the first portion 19a and the second portion 19b is a material showing the same conductivity type as that of the organic semiconductor material forming the organic semiconductor layer 17. The organic semiconductor material forming the contact layer 19' may be a material different from the organic semiconductor material forming the organic semiconductor layer 17.

Furthermore, when the conductivity type of the organic semiconductor layer 17 is the p type, the contact layer 19 is formed by the use of the organic semiconductor material having the conductivity type of the p type and the acceptor material. Meanwhile, when the conductivity type of the organic semiconductor layer 17 is the n type, the contact layer 19 is formed by the use of the organic semiconductor material having the conductivity type of the n type and the donor material.

Manufacturing Method

A method of manufacturing the thin film transistor 1-2 of the second embodiment as above will be described.

Firstly, in the same order as that described using FIGS. 1 to 2B in the first embodiment, the process is performed until the thin film transistor 1-1 having the configuration described in the first embodiment is formed. However, at this point of time, it is important to contain the acceptor material or the donor material of a sufficient amount to an extent such that the contact resistance between the organic semiconductor layer 17 and the source electrode 21s/the drain electrode 21d is reduced to form the contact layer 19.

Next, a process of removing the acceptor material or the donor material from the contact layer 19 by using the source electrode 21s/the drain electrode 21d as the mask is performed. As a result, the content of the acceptor material or the donor material in the contact layer portion exposed from the source electrode 21s/the drain electrode 21d is lower than the contact layer portion covered with the source electrode 21s/the drain electrode 21d. Moreover, as shown in FIG. 3, the contact layer 19' is formed which includes the first portion 19a in which the content of the acceptor material or the donor material is highly maintained, and the second portion 19b in which the content is adjusted to be lower than the first portion 19a.

In the removal of the acceptor material or the donor material that use the source electrode 21s/the drain electrode 21d as the mask, for example, two methods as below are exemplified.

A first method thereof is a method of selectively removing the acceptor material or the donor material from the contact layer (19) by the etching using the source electrode 21s/the drain electrode 21d as the mask. In this case, the wet etching using the etching solution, which selectively elutes only the acceptor material or the donor material, is performed on the organic semiconductor material. As a result, the portion covered with the source electrode 21s/the drain electrode 21d is protected from the etching solution, and the acceptor material or the donor material is preferentially eluted of the portion exposed from the source electrode 21s/the drain electrode 21d. Furthermore, an aqueous solution can be used as the etching solution.

As an example, in the case of forming the contact layer 19' of the p type, pentacene is used as the organic semiconductor material, molybdenum oxide ($MoO_3$) is used as the acceptor material, and water is used as the etching solution of the acceptor material. In the case of forming the contact layer 19' of the n type, perfluoropentacene is used as the organic semiconductor material, rubidium carbonate ($Rb_2CO_3$) is used as the donor material, and water is used as the etching solution of the donor material.

The selective removal of the acceptor material or the donor material by the wet etching as described above may be performed by the same process as the wet etching when performing the pattern formation of the source electrode 21s/the drain electrode 21d, or the removal of the resist mask used in the pattern formation. Furthermore, the selective removal may be added to such a process.

Next, a second method thereof is a method of selectively sublimating and removing the acceptor material or the donor material by the heating treatment using the source electrode 21s/the drain electrode 21d as the mask. In this case, the heating treatment is performed at a temperature equal to or lower than the sublimation temperature of the organic semiconductor material constituting the contact layer 19' and at a temperature equal to or higher than the sublimation temperature of the acceptor material or the donor material. For this reason, it is important that the organic semiconductor material constituting the contact layer 19' has a sublimation temperature higher than that of the acceptor material or the donor material constituting the contact layer 19'.

Furthermore, from the viewpoint of securing the material, it is desirable that the organic semiconductor material constituting the organic semiconductor layer 17 also has a sublimation temperature higher than that of the acceptor material or the donor material constituting the contact layer 19'. In addition, it is preferable that the temperature of the heating treatment is lower than the sublimation temperature of the organic semiconductor material constituting the organic semiconductor layer 17, and is lower than a glass transition temperature of each organic semiconductor material constituting the contact layer 19' and the organic semiconductor layer 17.

As an example, in the case of forming the contact layer 19' of the p type, pentacene is used as the organic semiconductor material, and tetrafluoro-1,4-benzoquinone is used as the acceptor material, thereby performing the heating treatment at an intermediate temperature. In the case of forming the contact layer 19' of the n type, fullerene is used as the organic semiconductor material, and tetrathiafulvalene is used as the donor material, thereby performing the heating treatment at an intermediate temperature. From the viewpoint of securing the material of the organic semiconductor material, it is desirable that the temperature of the heating treatment is low.

According to the above second embodiment, between the organic semiconductor layer 17 and the source electrode 21s/the drain electrode 21d, the contact layer 19' is provided which contains the acceptor material or the donor material with respect to the organic semiconductor material as impurities. As a result, similarly to the first embodiment, the contact layer 19 has the conductivity better than the organic semiconductor layer 17, whereby the contact resistance between the organic semiconductor layer 17 and the source electrode 21s/the drain electrode 21d is reduced. Furthermore, it is possible to reduce the bulk resistance that relies on the distance (that is, the thin thickness of the organic semiconductor layer 17) to the channel region ch formed on the source electrode 21s/the drain electrode 21d and the organic semiconductor layer 17. As a consequence, it is possible to promote an improvement in the ON current and the sharpening of the sub-threshold slope in the thin film transistor 1-2 of the top contact bottom gate structure.

Furthermore, in the second embodiment, the content of the acceptor material or the donor material in the contact layer 19' is set to be higher by the first portion 19a interposed between the organic semiconductor layer 17 and the source electrode 21s/the drain electrode 21d. As a result, the content of the acceptor material or the donor material in the first portion 19a can be set to a sufficient amount to an extent such that the contact resistance between the organic semiconductor layer 17 and the source electrode 21s/the drain electrode 21d is reduced. On the other hand, the content of the acceptor material or the donor material in the second portion 19b between the source electrode 21s and the drain electrode 21d can be set to a small value that can sufficiently maintain the OFF current to be low. As a consequence, as compared to the first embodiment, it is possible to reliably suppress the OFF current, while having the capability of promoting an improvement in the ON current and the sharpening of the sub-threshold slope.

Furthermore, in the manufacturing method of the second embodiment, as mentioned above, it is possible to obtain the thin film transistor 1-2 of the configuration having the different content of the acceptor material or the donor material by the first portion 19a and the second portion 19b as mentioned above. Furthermore, even in the manufacturing method of the second embodiment, the pattern formation of the source electrode 21s/the drain electrode 21d is performed on the upper portion of the contact layer 19 which contains the acceptor material or the donor material as impurities in the organic semiconductor material. As a result, it is possible to achieve the miniaturization of the thin film transistor 1-2 in which an improvement in property is promoted similarly to the first embodiment.

3. Third Embodiment

Figure 4A:
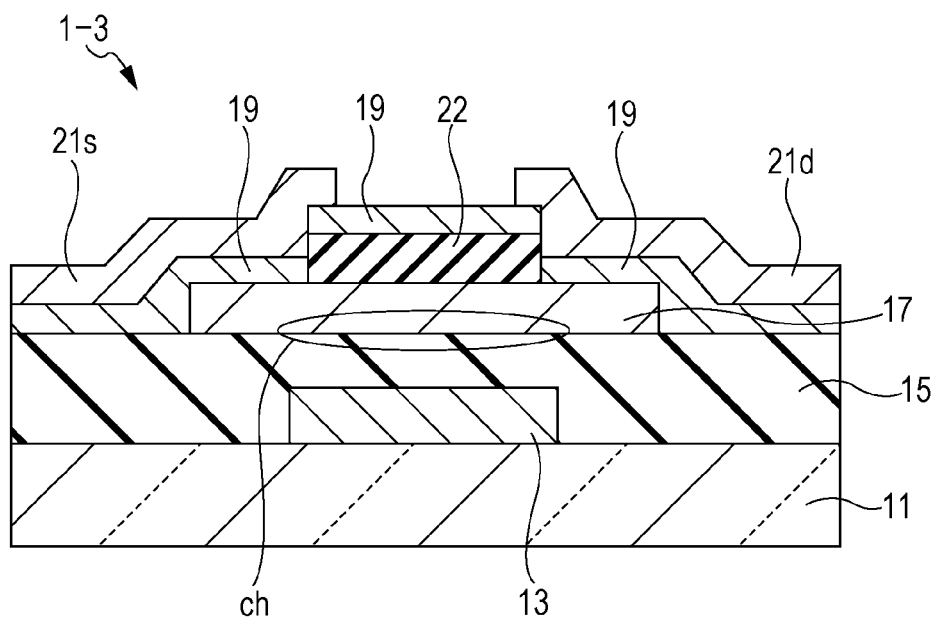
FIGS. 4A and 4B are a cross-sectional view and a plan view that show a configuration of a thin film transistor according to a third embodiment.
Figure 4B:
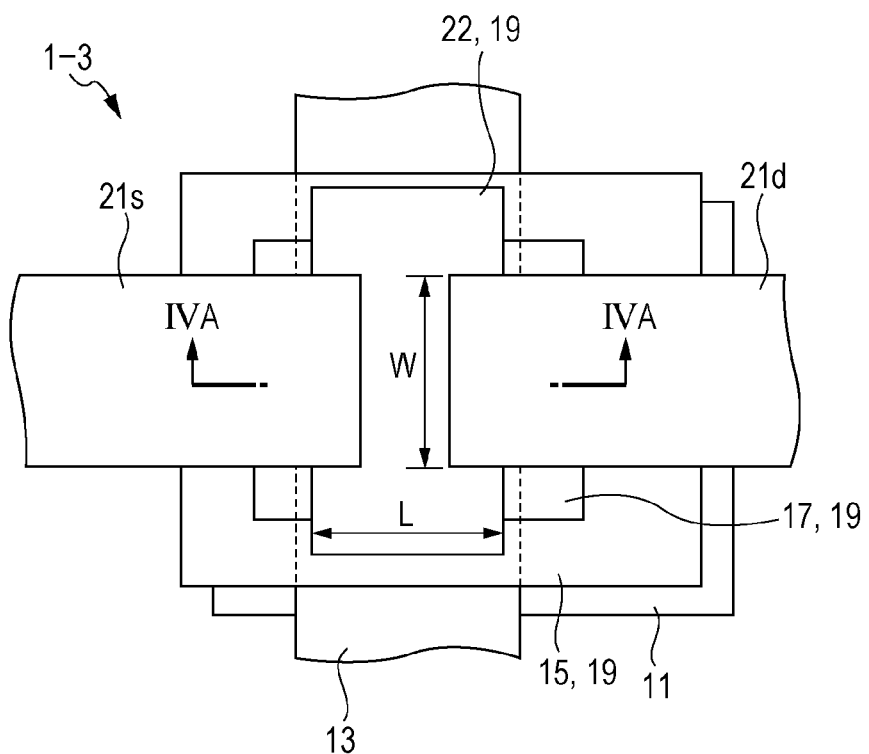

FIGS. 4A and 4B are cross-sectional view and plan view of a thin film transistor 1-3 of a third embodiment. The cross-sectional view corresponds to sections IVB-IVB in the plan view. The thin film transistor 1-3 shown in FIGS. 4A and 4B has the top contact bottom gate structure similar to the first and second embodiments, but is different from other embodiments in that a protective film 22 is provided on a channel region of the organic semiconductor layer 17.

That is, on the substrate 11, the gate insulating film 15 is provided in the state of covering the gate electrode 13. The organic semiconductor layer 17 is provided on the upper portion of the gate insulating film 15. The organic semiconductor layer 17 is patterned in the island shape for covering the gate electrode 13 in the width direction, and is provided in the state of being stacked on the gate electrode 13 via the gate insulating film 15. The protective film 22 is provided on the gate electrode film 15 provided with the organic semiconductor layer 17. The protective film 22 is stacked on the gate electrode 13, and has a shape that covers the channel region ch formed on the organic semiconductor layer 17 and exposes the organic semiconductor layer 17 portion at both sides of the gate electrode 13.

On the gate insulating film 15 provided with the protective film 22, the contact layer 19 is provided in the state of being stacked on the organic semiconductor layer 17 exposed from the protective film 22. The contact layer 19 is provided, for example, on the whole surface of the gate insulating film 15. On the contact layer 19, the source electrode 21s/the drain electrode 21d are provided in the position of being oppositely disposed with the gate electrode 13 interposed therebetween. The source electrode 21s/the drain electrode 21d are provided in the state in which the end portions thereof are disposed above the protective film 22, and are overlapped on the organic semiconductor layer 17 via the contact layer 19 at both sides of the protective film 22.

Herein, the protective film 22 as a unique component in the third embodiment is provided on at least the gate electrode 13 in the shape for covering the channel region ch formed on the organic semiconductor layer 17. Moreover, at both sides of the protective film 22, the source electrode 21s/the drain electrode 21d are connected to the organic semiconductor layer 17 via the contact layer 19. Thus, the channel region ch is formed on the organic semiconductor layer 17 portion of the lower portion of the protective film 22, whereby the width of the gate electrode direction in the protective film 22 becomes a channel length L. Furthermore, the widths of the source electrode 21s/the drain electrode 21d become a channel width W.

The protective film 22 is formed of an insulating material, and, for example, is formed of a photosensitive resist material.

Furthermore, the contact layer 19 may be stacked on the protective film 22. It is desirable that the contact layer 19 is in the state of being divided by an upper portion and a lower portion of the protective film 22 by a step of the film thickness of the protective film 22. Furthermore, the contact layer 19 may be divided on the protective film 22. In this case, in the contact layer 19, a division groove may be formed on the protective film 22. The division groove is provided at least over the width direction of the source electrode 21s/the drain electrode 21d, and is preferably provided in the state of crossing the organic semiconductor layer 17 of the island shape.

The contact layer 19 as mentioned above containing the organic semiconductor material and the acceptor material or the donor material is the same as that of the first embodiment. However, in the present third embodiment, the content of the acceptor material or the donor material in the contact layer 19 may be set to be higher than the first and second embodiments. Even in this case, the contact layer 19 is divided by the step of the protective film 22, whereby the OFF current does not flow between the source electrode 21s and the drain electrode 21d via the contact layer 19. Furthermore, in a case where an adjacent thin film transistor exists, the acceptor material or the donor material in the contact layer 19 has to be suppressed to an extent such that the element can be isolated.

Furthermore, details such as the material configuration of each component other than the contact layer 19 and the protective film 22 may be the same as those of the first embodiment.

Manufacturing Method

Next, a manufacturing process of the thin film transistor 1-3 of the third embodiment will be described based on the cross-sectional process diagram of FIGS. 5A to 5C.

Figure 5A:
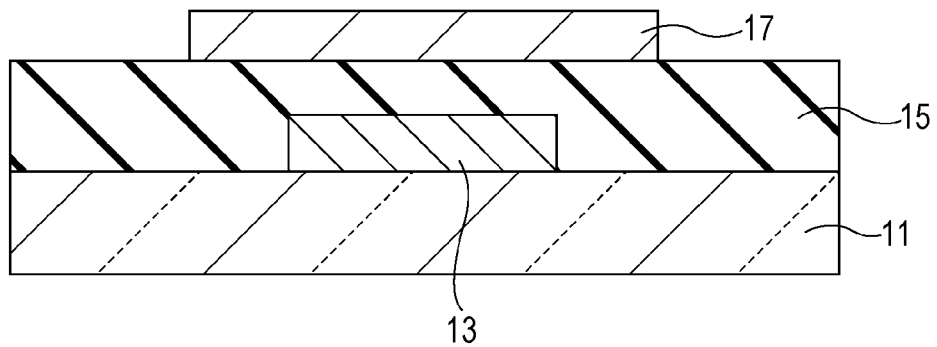
FIGS. 5A to 5C are cross-sectional process diagrams that show a manufacturing method of the thin film transistor according to the third embodiment.

Firstly, as shown in FIG. 5A, a pattern formation of the gate electrode 13 is performed on the substrate 11 and the patterned gate electrode 13 is covered with the gate insulating film 15. The process is performed similarly to the first embodiment thus far. Next, in a position of covering the gate electrode 13 on the gate insulating film 15, only the organic semiconductor layer 17 is patterned in an island shape. The pattern formation of the organic semiconductor layer 17 is the same as described in the first embodiment, and is performed by applying the pattern vapor deposition method using the mask or the printing method. Furthermore, when the organic semiconductor layer 17 is not patterned and the elements do not have to be isolated, the organic semiconductor layer 17 may be applied and formed.

Figure 5B:
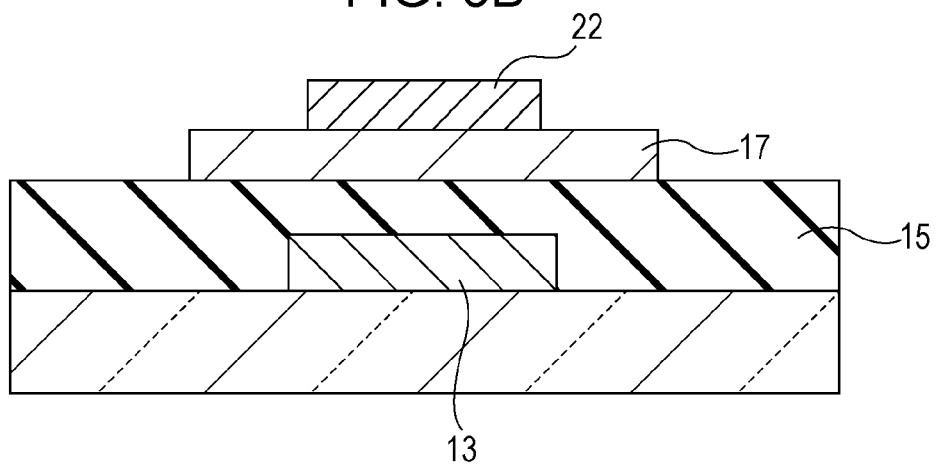

Next, as shown in FIG. 5B, the protective film 22 is formed on the gate insulating film 15 formed with the organic semiconductor layer 17. Herein, for example, the protective film 22 formed of the photosensitive resist material is formed by applying the lithography method. As a result, on the gate electrode 13 in the organic semiconductor layer 17, the protective film 22 is formed, the size of which is controlled to accurately meet the channel width. At this time, it is desirable that the film thickness of the protective film 22 is set to be sufficiently thick to an extent such that the contact layer 19 formed later is divided by the step of the protective film 22. Furthermore, the protective film 22 may be formed of an inorganic insulating material. In this case, the inorganic insulating material may be etched by using the resist pattern as the mask.

Figure 5C:
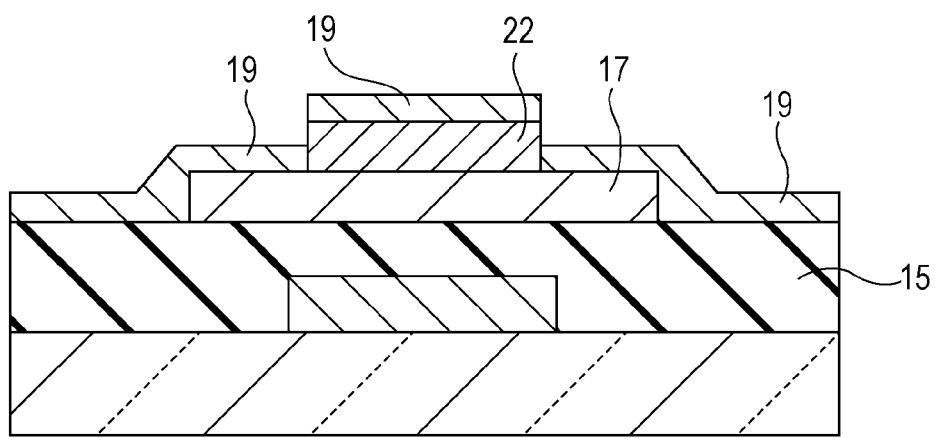

Next, as shown in FIG. 5C, by the film formation from the upper portion of the protective film 22, the contact layer 19 covering the upper portion of the gate insulating film 15 is formed. Herein, for example, the organic semiconductor material and the acceptor material or the donor material are codeposited to form the contact layer 19. Furthermore, for example, the contact layer 19 may be printed and formed using an ink liquid in which the organic semiconductor material and the acceptor material or the donor material are mixed with each other by applying the printing method. In addition, the contact layer 19 may be applied and formed using an application liquid in which the organic semiconductor material and the acceptor material or the donor material are mixed with each other.

Next, as shown in FIGS. 4A and 4B, on the contact layer 19, the source electrode 21s and the drain electrode 21d are formed, the end portions of which are oppositely disposed on the protective film 22. In the formation of the source electrode 21s/the drain electrode 21d, for example, a shadow mask method is applied. Furthermore, the electrodes may be formed as minute patterns by applying the lithography method in the same manner as the first embodiment.

Furthermore, in a case where the contact layer 19 is not divided by the upper portion and the lower portion of the protective film 22 at this point of time, a process of dividing the contact layer 19 on the protective film 22 may be performed.

In this case, it is desirable to perform a process of removing and dividing the contact layer 19 portion exposed between the source electrode 21s-the drain electrode 21d by laser ablation.

According to the third embodiment as mentioned above, similarly to the first embodiment, between the organic semiconductor layer 17 and the source electrode 21s/the drain electrode 21d, the contact layer 19 is provided which contains the acceptor material or the donor material as impurities in the organic semiconductor material. As a result, similarly to the first embodiment, the contact layer 19 has a better conductivity than the organic semiconductor layer 17, whereby the contact resistance between the organic semiconductor layer 17 and the source electrode 21s/the drain electrode 21d is reduced.

Furthermore, especially in the present third embodiment, the upper portion of the channel region ch is covered with the protective film 22. Even when the organic semiconductor layer 17 is formed to have an extremely thin film thickness, an expected extremely thin film thickness can be maintained. As a result, it is possible to reduce the bulk resistance that depends on the distance (that is, the film thickness of the organic semiconductor layer 17) to the channel region ch formed on the source electrode 21s/the drain electrode 21d and the organic semiconductor layer 17. In addition, the contact layer 19 is divided by the upper portion and the lower portion of the protective film 22. As a result, it is possible to prevent an increase in the OFF current through the contact layer 19. As a consequence, it is possible to promote an improvement of the ON current and the sharpening of the sub-threshold slope in the thin film transistor 1-3 of the top contact bottom gate structure.

Furthermore, even in the manufacturing method of the third embodiment, the pattern formation of the source electrode 21s/the drain electrode 21d is formed on the upper portion of the contact layer 19 that contains the acceptor material or the donor material as impurities in the organic semiconductor material. As a result, similarly to the first embodiment, it is possible to achieve the miniaturization of the thin film transistor 1-3 in which an improvement in property can be promoted.

Furthermore, the present third embodiment can also be combined with the second embodiment. In this case, in the state shown in FIGS. 4A and 4B, a process is performed which removes the acceptor material or the donor material from the contact layer 19 using the source electrode 21s/the drain electrode 21d as the mask. The process may be the same manner as described in the second embodiment.

In this manner, by combining the present third embodiment with the second embodiment, it is possible to make the content of the acceptor material or the donor material in the contact layer 19 portion under the source electrode 21s/the drain electrode 21d higher than those of other portions. As a result, it is possible to contain the acceptor material or the donor material of a sufficient amount in the contact layer 19 portion under the source electrode 21s/the drain electrode 21d to an extent such that the contact resistance between the organic semiconductor layer 17 and the source electrode 21s/the drain electrode 21d is reduced. On the other hand, the content of the acceptor material or the donor material in the other portions of the contact layer 19 can be set to a small value to an extent such that the elements can be sufficiently isolated.

As a consequence, it is possible to obtain a thin film transistor configuration able to cope with high integration while having capability for promoting an improvement in the ON current and the sharpening of the sub-threshold slope.

4. Fourth Embodiment

Figure 6A:
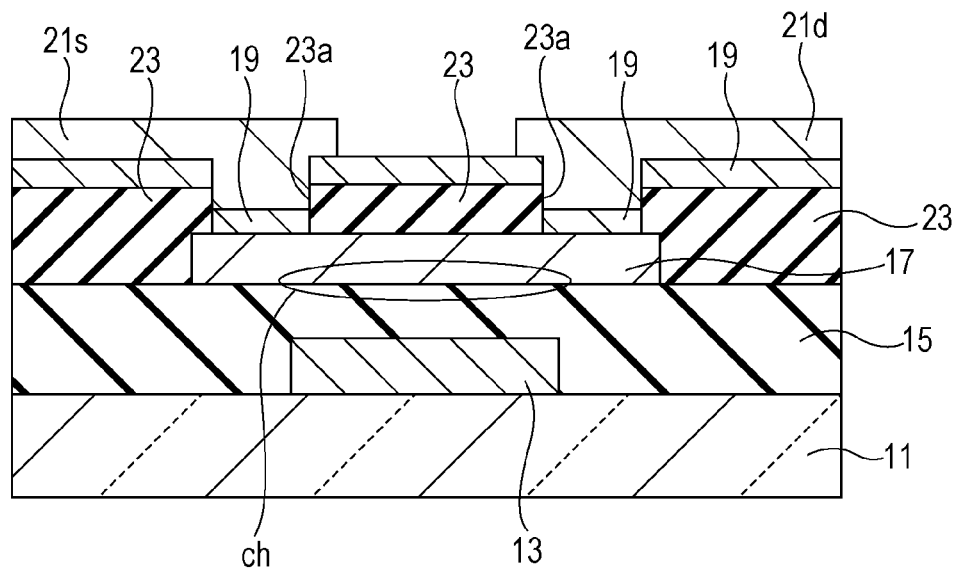
FIGS. 6A and 6B are cross-sectional view and a plan view that show a configuration of a thin film transistor according to a fourth embodiment.
Figure 6B:
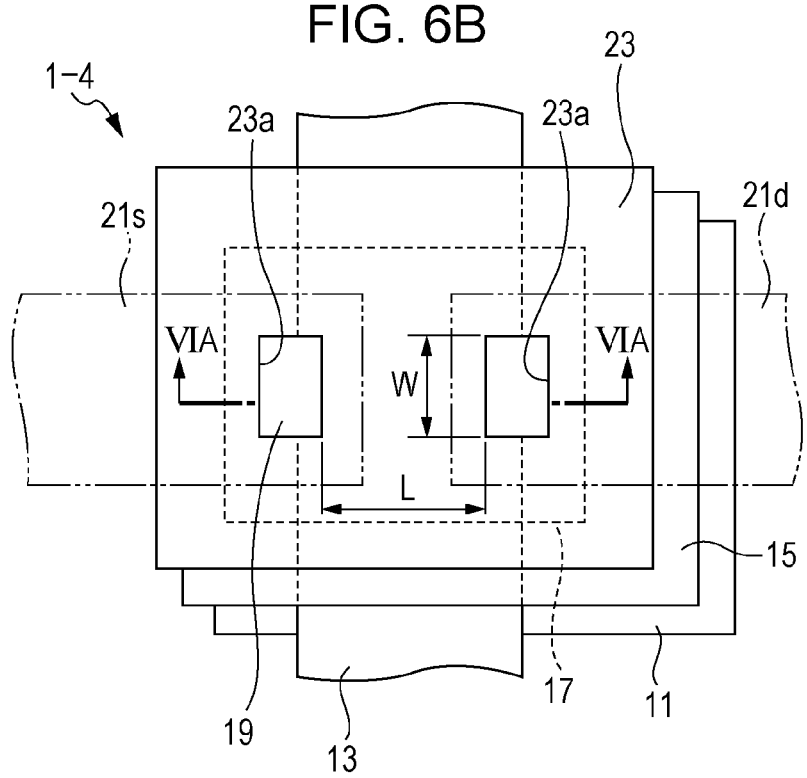

FIGS. 6A and 6B are a cross-sectional view and a plan view of a thin film transistor 1-4 of a fourth embodiment. The cross-sectional view corresponds to sections VIB-VIB in the plan view. The thin film transistor 1-4 shown in FIGS. 6A and 6B has the top contact bottom gate structure similar to the aforementioned first to third embodiments, and is different from other embodiments in that a protective film 23 is provided which widely covers the upper portion of the gate insulating film 15 provided with the organic semiconductor layer 17.

That is, on the substrate 11, the gate insulating film 15 is provided in the state of covering the gate electrode 13. The organic semiconductor layer 17 is provided on the upper portion of the gate insulating film 15. The organic semiconductor layer 17 is patterned in the island shape for covering the gate electrode 13 in the width direction, and is provided in the state of being stacked on the gate electrode 13 via the gate insulating film 15. A protective film 23 is provided on the gate insulating film 15 provided with the organic semiconductor layer 17. The protective film 23 is stacked on the gate electrode 13, and has an opening 23a that exposes the organic semiconductor layer 17 in the position of being oppositely disposed with the gate electrode 13 therebetween. On the protective film 23, the contact layer 19 is provided in the state of being stacked on the organic semiconductor layer 17 in the bottom portion of the opening 23a. Furthermore, on the protective film 23, the source electrode 21s/the drain electrode 21d are disposed in the position of being oppositely disposed with the gate electrode 13 therebetween. The source electrode 21s/the drain electrode 21d are provided in the state of being overlapped on the contact layer 19 in the bottom portion of the openings 23a that are oppositely disposed with the gate electrode 13 therebetween.

Herein, the protective film 23 as a component peculiar to the present fourth embodiment is provided in the shape that covers the upper portion of the channel region ch formed on the organic semiconductor layer 17 at least on the gate electrode 13. Moreover, on the bottom surface of the opening 23a, the source electrode 21s/the drain electrode 21d are connected to the organic semiconductor layer 17 via the contact layer 19. Thus, the channel region ch is formed in the organic semiconductor layer 17 portion between the openings 23a-23a, and the space between the openings 23a-23a become a channel length L.

Furthermore, as shown, when each opening 23a has an independent hole shape and the organic semiconductor layer 17 is exposed to the whole surface of the bottom portion, the width of the opening 23a along an extending direction of the gate electrode 13 becomes the channel width W. Furthermore, if the protective film 23 has at least a shape for covering the upper portion of the channel region ch formed on the organic semiconductor layer 17, the protective film 23 does not have to cover the whole surface on the substrate 11, but may be an island shape pattern. In this case, the widths of the source electrode 21s/the drain electrode 21d become the channel width.

The protective film 23 as mentioned above is formed of an insulating material, and is, for example, formed of a photosensitive resist material, and the opening 23a is provided by the lithography.

Furthermore, the contact layer 19 may also be stacked on the protective film 23 together with the organic semiconductor layer 17 of the bottom portion of the opening 23a of the protective film 23. It is desirable that the contact layer 19 is in the state of being divided on the opening 23a bottom portion and the protective film 23 by the step of the opening 23a portion. Furthermore, the contact layer 19 may be divided between two openings 23a-23a on the protective film 23. In this case, in the contact layer 19, a division groove is provided on the protective film 23 between the openings 23a-23a. The division groove is provided at least over the portion between the openings 23a-23a, and, preferably, is provided in the state of crossing the organic semiconductor layer 17 of an island shape.

The contact layer 19 as mentioned above containing the organic semiconductor material and the acceptor material or the donor material is the same as that of the above first embodiment. However, in the present fourth embodiment, the content of the acceptor material or the donor material in the contact layer 19 may be set to be higher than in the first to third embodiments. For example, the contact layer 19 may be formed of only either one of the acceptor material or the donor material. Even in this case, the contact layer 19 is divided between the openings 23a-23a, whereby the OFF current does not flow between the source electrode 21s and the drain electrode 21d via the contact layer 19.

Furthermore, details such as the material configurations of each component other than the contact layer 19 and the protective film 23 may be the same as those of the first embodiment.

Manufacturing Method

Next, a manufacturing process of the thin film transistor 1-4 of the fourth embodiment will be described based on the cross-sectional process diagram of FIGS. 7A and 7B.

Figure 7A:
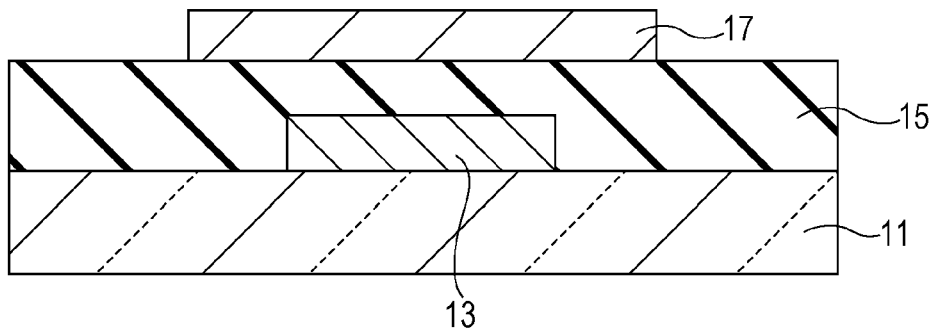
FIGS. 7A to 7C are cross-sectional process diagrams that show a manufacturing method of the thin film transistor according to the fourth embodiment.

Firstly, as shown in FIG. 7A, a pattern formation of the gate electrode 13 is performed on the substrate 11 and the patterned gate electrode 13 is covered with the gate insulating film 15. The process is performed similarly to the first embodiment thus far. Next, in a position of covering the gate electrode 13 on the gate insulating film 15, only the organic semiconductor layer 17 is patterned in an island shape. The pattern formation of the organic semiconductor layer 17 is the same as that described in the first embodiment, and is performed by applying the pattern vapor deposition method using the mask or the printing method. Furthermore, when the organic semiconductor layer 17 is not patterned and the elements do not have to be isolated, the organic semiconductor layer 17 may be applied and formed.

Figure 7B:
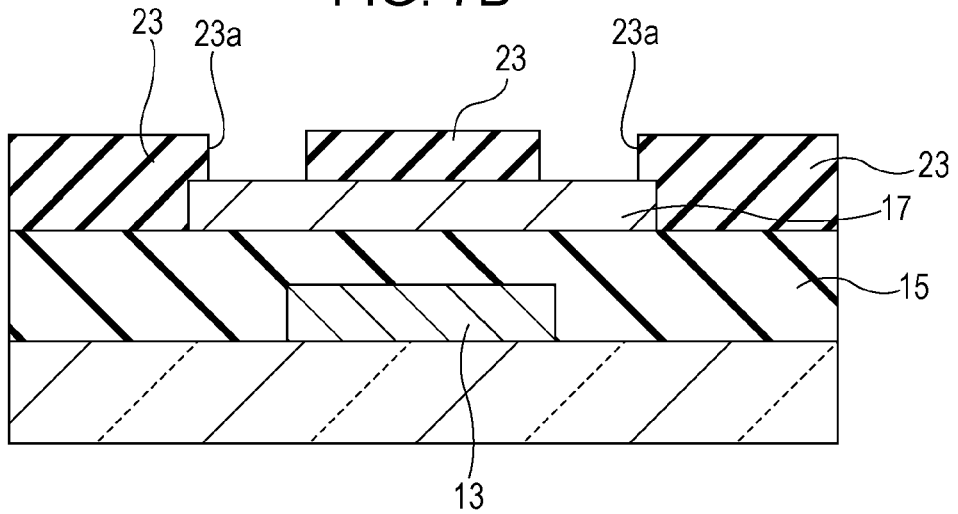

Next, as shown in FIG. 7B, the protective film 23 is formed on the gate insulating film 15 formed with the organic semiconductor layer 17. Herein, for example, the protective film 23 formed of the photosensitive resist material is formed by applying the lithography method. As a result, the protective film 23 is formed on which the openings 23a as minute patterns are accurately controlled in position with the gate electrode 13 interposed therebetween. At this time, it is desirable that the film thickness of the protective film 23 is set to be sufficiently thick to an extent such that the contact layer 19 formed later is divided by the step of the opening 23a portion. Furthermore, the protective film 23 may be formed of an inorganic insulating material. In this case, the inorganic insulating material may be etched by using the resist pattern as the mask.

Figure 7C:
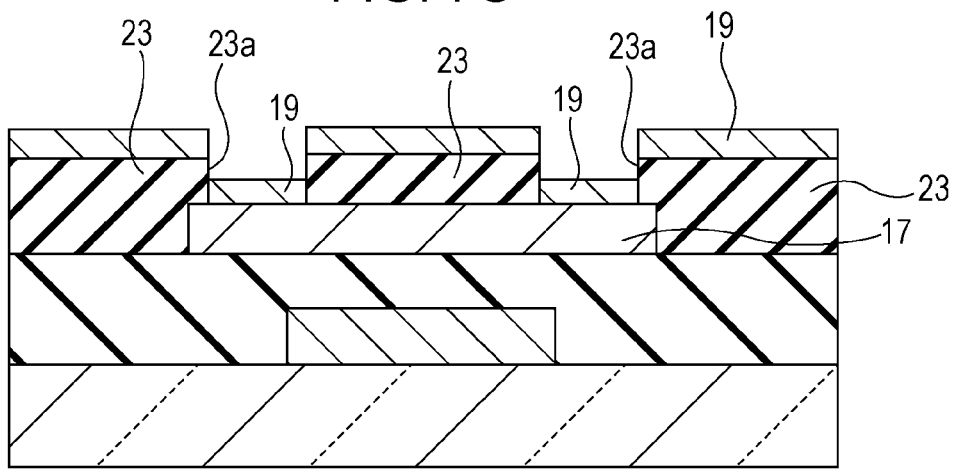

Next, as shown in FIG. 7C, by the film formation from the upper portion of the protective film 23, the contact layer 19 is formed on the organic semiconductor layer 17 of the opening 23a bottom portion. Herein, for example, the organic semiconductor material and the acceptor material or the donor material are co-deposited to form the contact layer 19. Furthermore, for example, the contact layer 19 may be printed and formed using an ink liquid in which the organic semiconductor material and the acceptor material or the donor material are mixed with each other by applying the printing method. In addition, the contact layer 19 may be applied and formed using an application liquid in which the organic semiconductor material and the acceptor material or the donor material are mixed with each other.

Next, as shown in FIGS. 6A and 6B, the source electrode 21s and the drain electrode 21d are formed on the protective film 23 provided with the contact layer 19. In the formation of the source electrode 21s/the drain electrode 21d, for example, a shadow mask method is applied. Furthermore, the electrodes may be formed as minute patterns by applying the lithography method in the same manner as the first embodiment.

Furthermore, in a case where the contact layer 19 of the opening 23a bottom portion in the protective film 23 and the contact layer 19 on the protective film 23 are not divided at this point of time, a process of dividing the contact layer 19 between two openings 23a-23a on the protective film 23 may be performed. In this case, it is desirable to perform a process of removing the contact layer 19 portion exposed to the upper portion of the gate electrode 13 by laser ablation to divide the contact layers 23 of two openings 23a-23a bottom portions.

According to the fourth embodiment as mentioned above, similarly to the first embodiment, between the organic semiconductor layer 17 and the source electrode 21s/the drain electrode 21d, the contact layer 19 is provided which contains the acceptor material or the donor material as impurities in the organic semiconductor material. As a result, the contact layer 19 has the better conductivity than the organic semiconductor layer 17, whereby the contact resistance between the organic semiconductor layer 17 and the source electrode 21s/the drain electrode 21d is reduced. Furthermore, the contact layers 19 are separately provided in the bottom portion of the openings 23a provided with the gate electrode 13 interposed therebetween, respectively. Thus, the contact layers 19 do not depend on the content of the acceptor material or the donor material and do not become a factor increasing the OFF current between the source electrode 21s and the drain electrode 21d. For this reason, an effect of reducing the contact resistance is higher than in other embodiments.

In addition, the patterning of the source electrode 21s/the drain electrode 21d is performed on the protective film 23. For this reason, even when the organic semiconductor layer 17 is formed to have an extremely thin film thickness, an expected extremely thin film thickness of the organic semiconductor layer 17 can be maintained without being affected by the forming process of the source electrode 21s/the drain electrode 21d. As a result, it is possible to reduce the bulk resistance that depends on the distance (that is, the film thickness of the organic semiconductor layer 17) to the channel region ch formed on the source electrode 21s/the drain electrode 21d and the organic semiconductor layer 17.

As a consequence, it is possible to promote an improvement of the ON current and the sharpening of the sub-threshold slope in the thin film transistor 1-4 of the top contact bottom gate structure, while applying the miniaturization process.

Furthermore, the present fourth embodiment can also be combined with the second embodiment. In this case, in the state shown in FIGS. 6A and 6B, a process is performed which removes the acceptor material or the donor material from the contact layer 19 using the source electrode 21s/the drain electrode 21d as the mask. The process may be performed in the same manner as described in the second embodiment.

In this manner, by combining the present fourth embodiment with the second embodiment, it is possible to make the content of the acceptor material or the donor material in the contact layer 19 portion under the source electrode 21s/the drain electrode 21d higher than those of other portions. As a result, it is possible to contain the acceptor material or the donor material of the sufficient amount in the contact layer 19 portion under the source electrode 21s/the drain electrode 21d to an extent such that the contact resistance between the organic semiconductor layer 17 and the source electrode 21s/the drain electrode 21d is reduced. On the other hand, the content of the acceptor material or the donor material in the other portions of the contact layer 19 can be set to a small value to an extent such that the elements can be sufficiently isolated.

As a consequence, it is possible to obtain a thin film transistor configuration able to cope with high integration while having a capability for promoting an improvement in the ON current and the sharpening of the sub-threshold slope.

5. Fifth Embodiment

Figure 8:
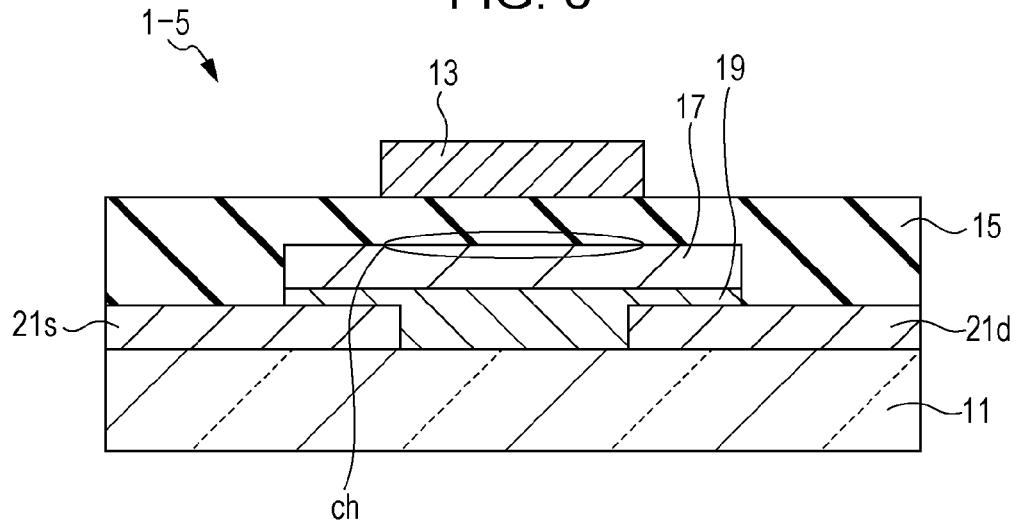
FIG. 8 is a cross-sectional view and a plan view that show a configuration of a thin film transistor according to a fifth embodiment.

FIG. 8 is a cross-sectional view of a thin film transistor 1-5 of a fifth embodiment. The thin film transistor 1-5 shown in FIG. 8 has a bottom contact top gate structure, and the source electrode 21s/the drain electrode 21d are provided on a substrate 11. On the substrate 11, a stacked body of the contact layer 19 and the organic semiconductor layer 17 is provided in this order over the portion between the source electrode 21s and the drain electrode 21d. The stacked body is patterned in an island shape, and is provided in the state in which the island-shaped edge portion is overlapped on the edge portions of the source electrode 21s/the drain electrode 21d oppositely disposed. Furthermore, the gate insulating film 15 is provided on the substrate 11 in the state of covering the substrate 11. The gate electrode 13 is provided on the gate insulating film 15 in the position corresponding to the portion between the source electrode 21s and the drain electrode 21d in the state of crossing the center portion of the organic semiconductor layer 17.

In the present fifth embodiment described above, similarly to the first embodiment, the contact layer 19 having the same pattern as the organic semiconductor layer 17 is stacked on the organic semiconductor layer 17, and the contact layer 19 contains the organic semiconductor material and the acceptor material or the donor material. Hereinafter, details of the material configurations of each component and the like may be the same as the first embodiment.

Manufacturing Method

Next, a manufacturing process of the thin film transistor 1-5 of the fifth embodiment will be described based on the cross-sectional process diagram of FIGS. 9A and 9B.

Figure 9A:
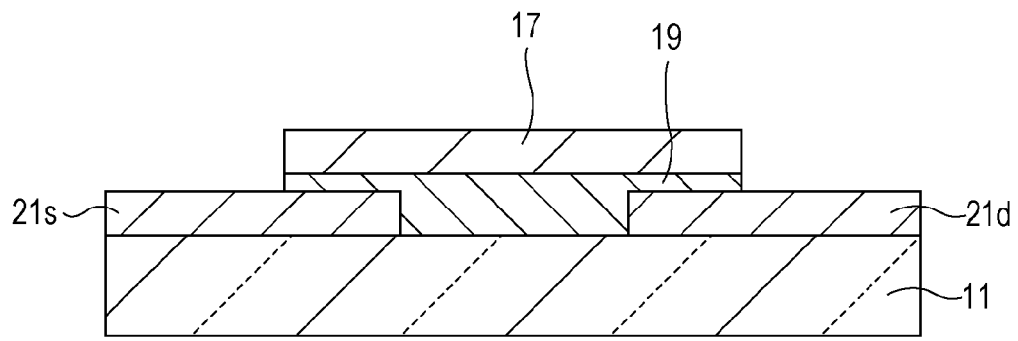
FIGS. 9A and 9B are cross-sectional process diagrams that show a manufacturing method of the thin film transistor according to the fifth embodiment.

Firstly, as shown in FIG. 9A, the source electrode 21s and the drain electrode 21d are formed on the substrate 11. The formation of the source electrode 21s/the drain electrode 21d is performed similarly to that described in the first embodiment. That is, the electrodes are preferably formed as minute patterns by applying the lithography method, and may be formed by applying a shadow mask method as another method.

Next, on the substrate 11 formed with the source electrode 21s/the drain electrode 21d, the stacked body of the contact layer 19 and the organic semiconductor layer 17 is subjected to the pattern formation in an island shape over the portion between the source electrode 21s and the drain electrode 21d.

Herein, for example, by applying the pattern vapor deposition method using a mask, firstly, the organic semiconductor material and the acceptor material or the donor material are co-deposited to perform the pattern formation of the contact layer 19, and then, the organic semiconductor material is vapor-deposited to perform the pattern formation of the organic semiconductor layer 17. Furthermore, for example, by applying the printing method, firstly, the pattern printing of the contact layer 19 is performed using the ink liquid in which the organic semiconductor material and the acceptor material or the donor material are mixed with each other, and then, the pattern printing of the organic semiconductor layer 17 may be performed. Furthermore, when the contact layer 19 and the organic semiconductor layer 17 are not patterned and the elements do not have to be isolated, the layers 19 and 17 may be applied and formed in this order.

Figure 9B:
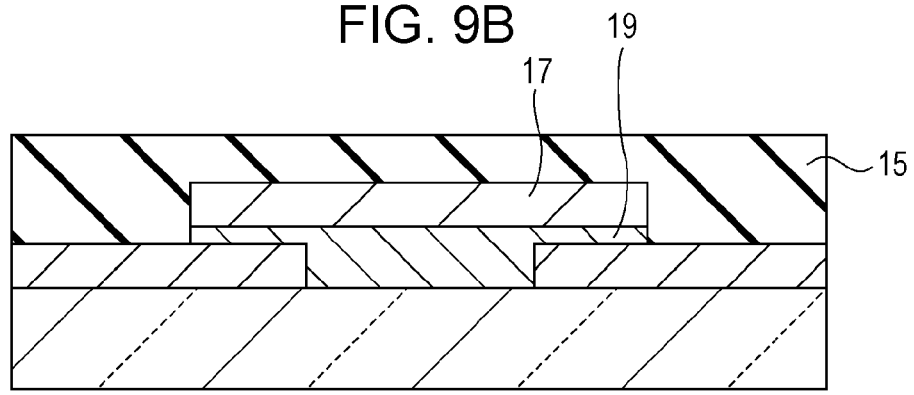

Next, as shown in FIG. 9B, the gate insulating film 15 is formed on the substrate 11 in the state of covering the stacked body of the source electrode 21s/the drain electrode 21d, the contact layer 19, and the organic semiconductor layer 17. In the case of using an organic insulation material, the film formation of the gate insulating film 15 is performed by applying an application method including the printing methods such as a spin coat method, screen printing, gravure printing, and an ink jet method. Meanwhile, in the case of using an inorganic insulation material, film formation is performed by applying the vapor deposition, sputtering, and the CVD method.

After that, as shown in FIG. 8, the gate electrode 13 is formed on the gate insulating film 15. The formation of the gate electrode 13 is performed in the same manner as described in the first embodiment. That is, the resist pattern is formed by the photolithography method, and the pattern etching of the metallic material film is performed using the same as the mask, or printing techniques such as screen printing, gravure printing, and an ink jet may be applied.

According to the fifth embodiment described above, similarly to the first embodiment, between the organic semiconductor layer 17 and the source electrode 21s/the drain electrode 21d, the contact layer 19 is provided which contains the acceptor material or the donor material as impurities in the organic semiconductor material. As a result, the contact layer 19 has better conductivity than the organic semiconductor layer 17, whereby the contact resistance between the organic semiconductor layer 17 and the source electrode 21s/the drain electrode 21d is reduced.

Furthermore, since the conductivity of the contact layer 19 is adjusted by the content of the acceptor material or the donor material, even when the contact layer 19 is left between the source electrode 21s and the drain electrode 21d as it is as a part of the organic semiconductor layer 17, an increase in the OFF current can be prevented. Thus, the contact layer 19 is formed in the same pattern as the organic semiconductor layer 17 in the state of covering between the source electrode 21s/the drain electrode 21d, whereby the step angular portions of the source electrode 21s/the drain electrode 21d can be covered. As a result, even when the contact layer 19 in the organic semiconductor layer 17 is formed to have an extremely thin film thickness, it is possible to prevent the organic semiconductor layer 17 from breaking off in the step of the source electrode 21s/the drain electrode 21d. For this reason, it is possible to reduce bulk resistance which depends on a distance (that is, the film thickness of the organic semiconductor layer 17) to a channel region ch formed on the source electrode 21s/the drain electrode 21d and the organic semiconductor layer 17.

As a consequence, it is possible to promote an improvement in the ON current and the sharpening of the sub-threshold slope in the thin film transistor 1-5 having the bottom contact top gate structure, while applying the miniaturization process.

6. Sixth Embodiment

Next, a configuration of a display device including a thin film transistor of the configuration described in the aforementioned embodiment will be described. Herein, a display device of an active matrix type using an organic electroluminescence element EL will be described as an example of the display device.

Layer Configuration of Display Device

Figure 10:
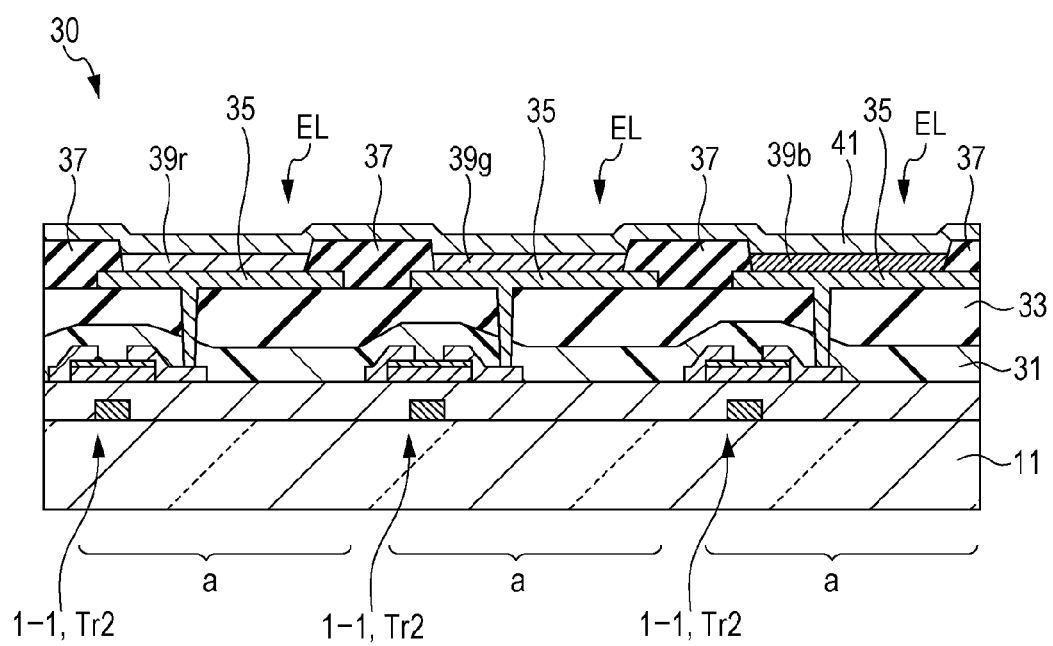
FIG. 10 is a cross-sectional view that shows an example of a display device according to a sixth embodiment.

FIG. 10 is a configuration diagram of three pixels of a display device 30 to which the embodiment of the present disclosure was applied. The display device 30 is configured by using the thin film transistor of an embodiment of the present disclosure exemplified in the first to fifth embodiments, and a configuration is shown which is provided with the thin film transistor 1-1 of the top contact bottom gate structure described in the first embodiment as an example.

As shown in FIG. 10, the display device 30 is a display device 30 of an active matrix type in which a pixel circuit using the thin film transistor 1-1 and the organic electroluminescence element EL connected thereto are arranged on each pixel a on the substrate 11.

The upper portion of the substrate 11 with the pixel circuit using the thin film transistor 1-1 arranged thereon is covered with a passivation film 31, and a planarization insulating film 33 is provided on the upper portion thereof. In the planarization insulating film 31 and the passivation film 31, connection holes 31a reaching the respective thin film transistors 1-1 are provided. On the planarization insulating film 31, pixel electrodes 35 connected to the thin film transistor via the respective connection holes 31a are arranged and formed.

Peripheries of each pixel electrodes 35 are covered with window insulating films 37 and elements are isolated from each other. The upper portions of each of the pixel electrodes 35 with elements isolated from each other are covered with organic light emitting function layers 39r, 39g, and 39b of each color, and a common electrode 41 common to each pixel a is provided in the state of covering the layers. Each of organic light emitting function layers 39r, 39g, and 39b has a stacked structure including at least the organic light emitting layer, at least the organic light emitting layer is subjected to the pattern formation by the configurations different for each pixel and may have a layer common to each pixel. The common electrode 41 is, for example, formed as a cathode, and if a display device to be produced is an upper surface light emitting type which extracts a light emitting light from an opposite side of the substrate 11, the common electrode 41 is formed as a light transmitting electrode.

As mentioned above, in each pixel a portion in which the organic light emitting function layers 39r, 39g, and 39b are interposed between the pixel electrode 35 and the common electrode 41, the organic electroluminescence element EL is formed. Furthermore, although it is not shown, a protective layer is provided on the substrate 11 formed with the organic electroluminescence element EL, and a sealing substrate is bonded via an adhesive, whereby the display device 30 is configured.

Circuit Configuration of Display Device

Figure 11:
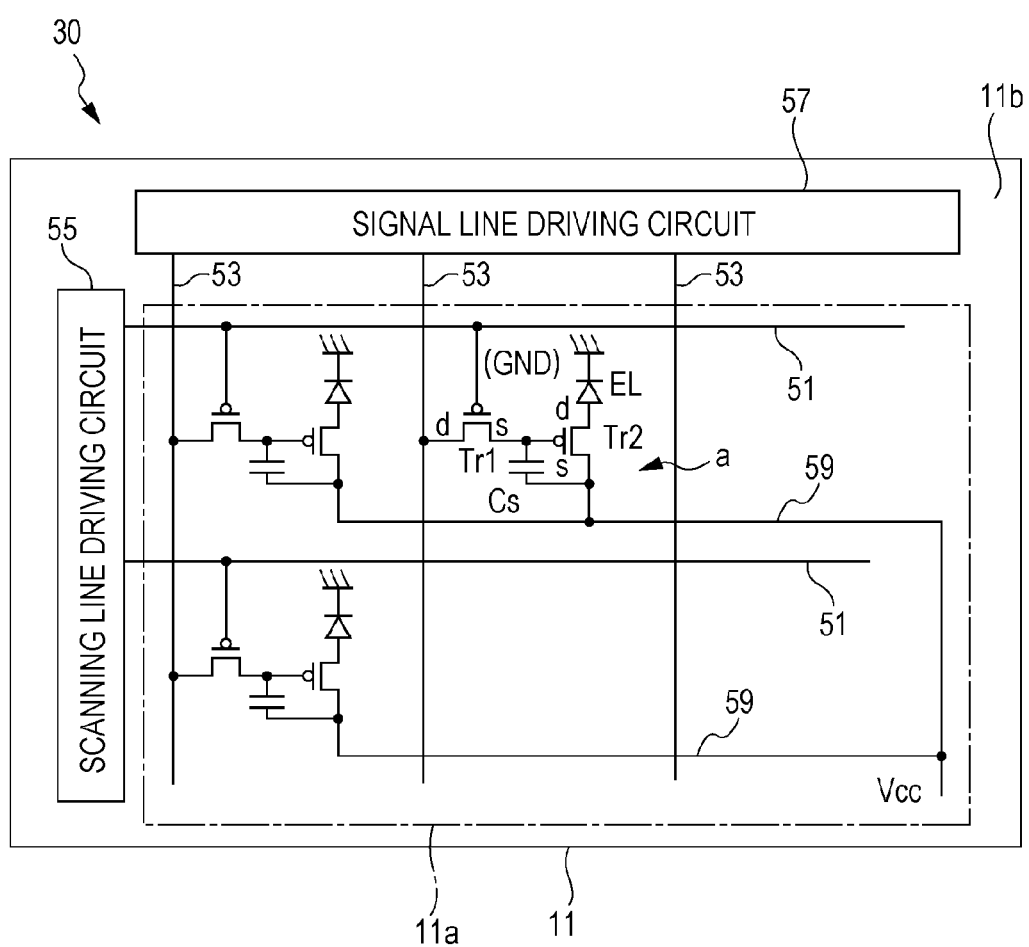
FIG. 11 is a circuit configuration diagram of the display device according to the sixth embodiment.

FIG. 11 shows an example of a circuit configuration diagram of the display device 30. Furthermore, the circuit configuration described herein is merely an example.

As shown in FIG. 11, on the substrate 11 of the display device 30, a display region 11a and a peripheral region 11b thereof are set. In the display region 11a, a plurality of scanning lines 51 and a plurality of signal lines 53 are wired vertically and longitudinally, and are configured as pixel array portions on which one pixel a is provided to correspond to each intersection portion. Furthermore, in the peripheral region 11b, a scanning line driving circuit 55 which scans and drives the scanning line 51, and a signal line driving circuit 57, which supplies an image signal (that is, an input signal) depending on luminance information to the signal line 53, are disposed.

The pixel circuit provided in each intersection portion of the scanning line 51 and the signal line 53 includes, for example, a switching thin film transistor Tr1, a driving thin film transistor Tr2, a maintenance capacity Cs, and an electroluminescence element EL.

In the display device 30, by the driving due to the scanning line driving circuit 55, the image signal written in from the signal line 53 via the switching thin film transistor Tr1 is maintained in the maintenance capacity Cs. Moreover, the electric current depending on the maintained signal amount is supplied from the driving thin film transistor Tr2 to the organic electroluminescence element EL, whereby the organic electroluminescence element EL emits light at a luminance depending on the electric current value. Furthermore, the driving thin film transistor Tr2 is connected to the common power source supply line (Vcc) 59.

Furthermore, the configuration of the pixel circuit as mentioned above is merely an example, and a capacitor element or a plurality of transistors may be provided in the pixel circuit as necessary to constitute the pixel circuit. Furthermore, a necessary driving circuit is added to the peripheral region 11b, depending on an alteration of a pixel circuit.

In such a circuit configuration, the thin film transistors Tr1 and Tr2 are constituted as the thin film transistor according to an embodiment of the present disclosure exemplified in the aforementioned embodiment. Furthermore, FIG. 10 shows a cross-sectional view of a portion in which the thin film transistor Tr2 and the organic electroluminescence element EL are stacked, as a cross-sectional view of the three pixels in the display device 30 of the circuit configuration as mentioned above. The switching thin film transistor Tr1 and the capacitor element Cs are also formed on the same layer as the driving thin film transistor Tr2. Furthermore, FIG. 11 shows a case where the thin film transistors Tr1 and Tr2 are p channel types.

In the display device 30 of the configuration as mentioned above, as mentioned in the first to fifth embodiments, the pixel circuit is constituted by applying the miniaturization process and using the thin film transistor 1-1 having a satisfactory element property. This makes it possible to achieve a high functionality and high integration of the pixel.

Furthermore, in the aforementioned sixth embodiment, an organic EL display device was described as an example of the display device according to an embodiment of the present disclosure. However, the display device according to an embodiment of the present disclosure can be widely applied to a display device that uses the thin film transistor, particularly, a display device of an active matrix type in which the thin film transistor is connected to the pixel electrode, and the same effect can be obtained. As such a display device, for example, a liquid crystal display device or an electrophoretic type display device is exemplified and the same effect can be obtained.

7. Seventh Embodiment

FIGS. 12 to 16G describe an example of electronic equipment according to an embodiment of the present disclosure as mentioned above. The electronic equipment described herein is the electronic equipment in which the display device described in the sixth embodiment is used as a display portion. Furthermore, the display device according to an embodiment of the present disclosure, an example of which is described in the sixth embodiment, can be applied to the display portion in the electronic equipment of all fields that display the image signal input to the electronic equipment, and the image signal created in the electronic equipment. Hereinafter, an example of the electronic equipment, to which an embodiment of the present disclosure is applied, will be described.

Figure 12:
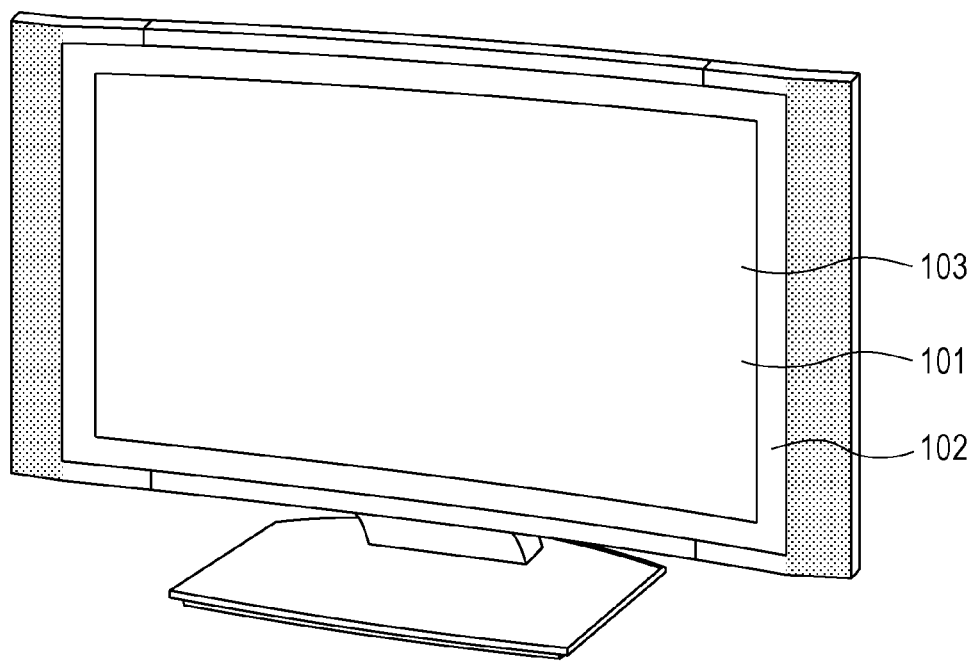
FIG. 12 is a perspective view that shows a television that uses the display device according to an embodiment of the present disclosure.

FIG. 12 is a perspective view that shows a television to which an embodiment of the present disclosure is applied. The television according to the present application example includes an image display screen portion 101 that has a front panel 102, a filter glass 103, or the like, and the image display screen portion 101 is created by the use of the display device according to an embodiment of the present disclosure.

Figure 13A:
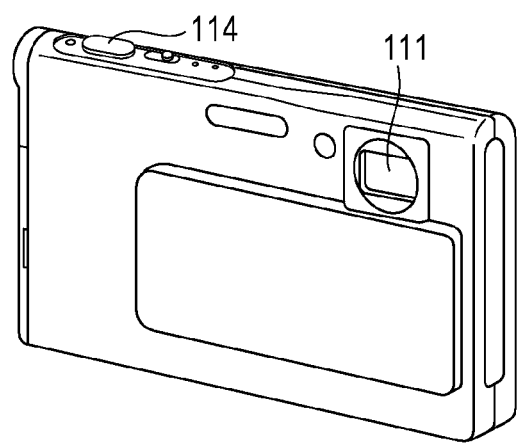
FIG. 13A is a perspective view that shows a digital camera using the display device of an embodiment of the present disclosure when viewed from a front side.
Figure 13B:
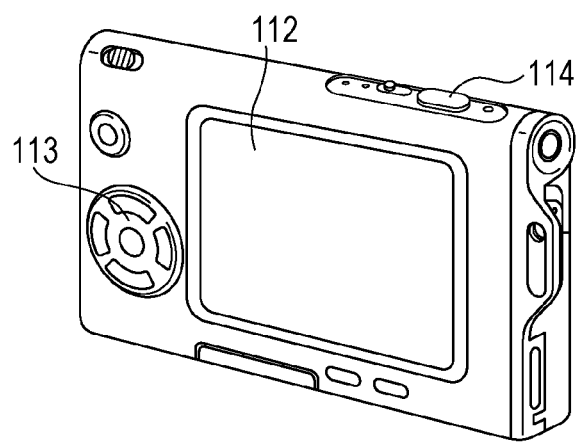
FIG. 13B is a perspective view that shows a digital camera using the display device of an embodiment of the present disclosure when viewed from a rear side.

FIGS. 13A and 13B are diagrams that show a digital camera to which an embodiment of the present disclosure is applied, FIG. 13A is a perspective view when viewed from a front side thereof, and FIG. 13B is a perspective view when viewed from a rear side thereof. The digital camera according to the present application example of includes a light emitting portion 111 for flash, a display portion 112, a menu switch 113, a shutter button 114, and the like, and the display portion 112 is manufactured by using the display device according to an embodiment of the present disclosure.

Figure 14:
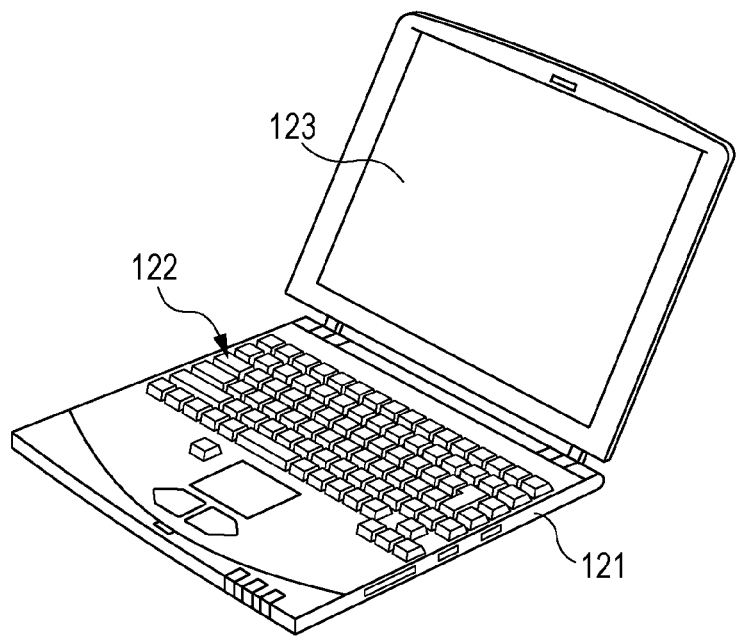
FIG. 14 is a perspective view that shows a notebook type of personal computer using the display device according to an embodiment of the present disclosure.

FIG. 14 is a perspective view that shows a notebook type personal computer to which an embodiment of the present disclosure is applied. The notebook type personal computer according to the present application example includes a keyboard 122 which is operated when inputting a letter and the like into a main body 121, a display portion 123 that displays an image or the like, and the display portion 123 is manufactured using a display device according to an embodiment of the present disclosure.

Figure 15:
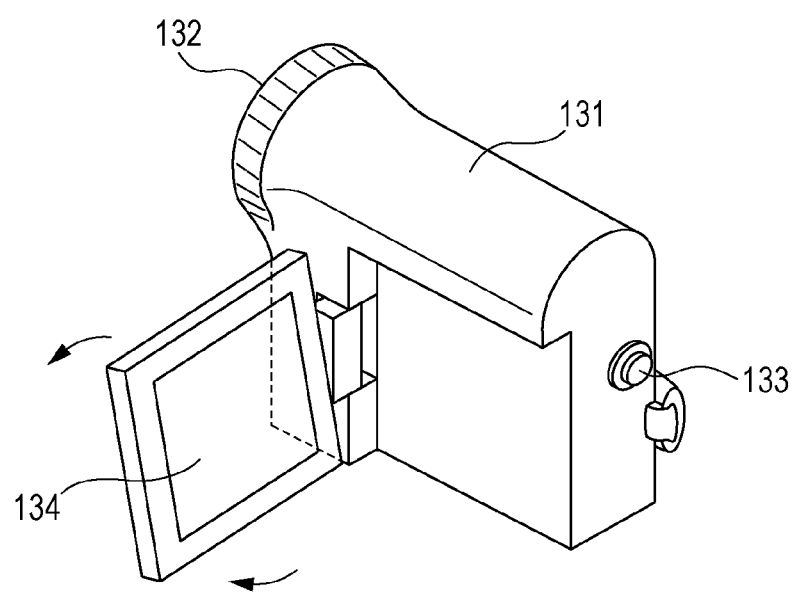
FIG. 15 is a perspective view that shows a video camera using the display device according to an embodiment of the present disclosure.

FIG. 15 is a perspective view that shows a video camera to which an embodiment of the present disclosure is applied. The video camera according to the present application example includes a main body portion 131, a subject imaging lens 132 on a side surface facing forward, a start/stop switch 133 for shooting, a display portion 134, or the like, and the display portion 134 is manufactured using the display device according to an embodiment of the present disclosure.

FIGS. 16A to 16G are diagrams that show a mobile terminal device to which an embodiment of the present disclosure is applied, for example, a mobile phone, FIG. 16A is a front view in an open state, FIG. 16B is a side view thereof, FIG. 16C is a front view in a closed state, FIG. 16D is a left side view thereof, FIG. 16E is a right side view thereof, FIG. 16F is a top view thereof, and FIG. 16G is a bottom view thereof. The mobile phone according to the present application example includes an upper case 141, a lower case 142, a connection portion (herein, a hinge portion) 143, a display 144, a sub display 145, a picture light 146, a camera 147, or the like. Among these, the display 144 or the sub display 145 is manufactured using the display device according to an embodiment of the present disclosure.

Furthermore, the aforementioned seventh embodiment shows each example of the display device as an example of the electronic equipment according to an embodiment of the present disclosure and the electronic equipment which uses the display device as the display portion. However, the electronic equipment according to an embodiment of the present disclosure is not limited to the application which uses such a display portion, but can be widely applied to the electronic equipment loaded with the thin film transistor in the state of being connected to the conductive pattern. As such an example, an embodiment of the present disclosure can be applied to electronic equipment such as an ID tag, and a sensor, and the same effect can be achieved.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a thin film transistor comprising:
providing a substrate with a gate electrode and a gate insulating layer thereon, in that order proceeding from the substrate, the gate insulating layer having a planar surface facing away from the substrate;
forming an organic semiconductor layer extending along only one plane of the gate insulating layer and not beyond the one plane of the gate insulating layer, the organic semiconductor layer having an island shape;
forming a contact layer containing (a) an organic semiconductor material and an acceptor material or (b) an organic semiconductor material and a donor material on the organic semiconductor layer;
patterning the organic semiconductor layer and the contact layer in the same form;
forming a source electrode and drain electrode with end portions thereof on opposite ends of the contact layer; and
removing the acceptor material or the donor material from the contact layer using the source and drain electrodes as a mask,
wherein the step of forming the source and drain electrodes is performed between the step of patterning and the step of removing the acceptor material or donor material.

2. The method according to claim 1, wherein the process of removing the acceptor material or the donor material from the contact layer is performed by selectively etching the acceptor material or the donor material on the organic semiconductor material constituting the contact layer.

3. The method according to claim 1, wherein the process of removing the acceptor material or the donor material from the contact layer is performed by a heating treatment at a temperature equal to or less than a sublimation temperature of the organic semiconductor material constituting the contact layer and at a temperature equal to or higher than a sublimation temperature of the acceptor material or the donor material.

4. The method according to claim 1, wherein:
before forming the organic semiconductor layer, a process of forming a gate electrode on the substrate and a gate insulting film on the substrate in the state of covering the gate electrode is performed; and
after forming the organic semiconductor layer and the contact layer, the source and drain electrodes are formed such that end portions are on the contact layer with the gate electrode interposed therebetween.

* * * * *